(12) United States Patent
Sakai et al.

(10) Patent No.: US 11,211,774 B2
(45) Date of Patent: Dec. 28, 2021

(54) LIGHT EMITTING DEVICE, OPTICAL DEVICE, AND INFORMATION PROCESSING APPARATUS

(71) Applicant: FUJIFILM Business Innovation Corp., Tokyo (JP)

(72) Inventors: Kazuhiro Sakai, Kanagawa (JP); Daisuke Iguchi, Kanagawa (JP); Takeshi Minamiru, Kanagawa (JP); Yoshinori Shirakawa, Kanagawa (JP); Tomoaki Sakita, Kanagawa (JP); Tsutomu Otsuka, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 181 days.

(21) Appl. No.: 16/719,940

(22) Filed: Dec. 18, 2019

(65) Prior Publication Data

US 2020/0328576 A1    Oct. 15, 2020

(30) Foreign Application Priority Data

Apr. 15, 2019 (JP) .............................. JP2019-076837

(51) Int. Cl.
*H01S 5/42* (2006.01)
*H01S 5/02255* (2021.01)
(Continued)

(52) U.S. Cl.
CPC ............ *H01S 5/423* (2013.01); *G02B 5/0278* (2013.01); *G02B 27/4205* (2013.01); *G06K 9/00201* (2013.01); *G06K 9/00255* (2013.01); *G06K 9/2036* (2013.01); *H01S 5/02255* (2021.01); *H01S 5/02325* (2021.01);
(Continued)

(58) Field of Classification Search
None
See application file for complete search history.

(56) References Cited

U.S. PATENT DOCUMENTS

2019/0335073 A1   10/2019   Yamashita et al.
2020/0090608 A1*   3/2020   Calayir ................. H05B 45/46
2020/0249320 A1*   8/2020   Sakita ................... G01S 17/894

FOREIGN PATENT DOCUMENTS

CN    109410782 A   *   3/2019
CN    107342375 B   *   5/2019   ........ H01L 27/1218
(Continued)

*Primary Examiner* — Mohammed Rachedine
(74) *Attorney, Agent, or Firm* — JCIPRNET

(57) ABSTRACT

A light emitting device includes a wiring substrate, a light emitting element array that includes a first side surface and a second side surface facing each other, and a third side surface and a fourth side surface connecting the first side surface and the second side surface to each other and facing each other, the light emitting element array being provided on the wiring substrate, a driving element that is provided on the wiring substrate on the first side surface side and drives the light emitting element array, a first circuit element and a second circuit element that are provided on the wiring substrate on the second side surface side to be arranged in a direction along the second side surface, and a wiring member that is provided on the third side surface side and the fourth side surface side and extends from a top electrode of the light emitting element array toward an outside of the light emitting element array.

20 Claims, 12 Drawing Sheets

(51) Int. Cl.
| | |
|---|---|
| *H01S 5/02325* | (2021.01) |
| *H01S 5/068* | (2006.01) |
| *H01S 5/0687* | (2006.01) |
| *H01S 5/042* | (2006.01) |
| *H01S 5/02* | (2006.01) |
| *H01S 5/183* | (2006.01) |
| *H01S 5/30* | (2006.01) |
| *H01S 5/343* | (2006.01) |
| *H01S 5/20* | (2006.01) |
| *G02B 27/42* | (2006.01) |
| *G02B 5/02* | (2006.01) |
| *G06K 9/00* | (2006.01) |
| *G06K 9/20* | (2006.01) |

(52) U.S. Cl.
CPC ........ *H01S 5/0687* (2013.01); *H01S 5/06804* (2013.01); *H01S 5/0206* (2013.01); *H01S 5/04252* (2019.08); *H01S 5/04254* (2019.08); *H01S 5/18347* (2013.01); *H01S 5/18361* (2013.01); *H01S 5/2054* (2013.01); *H01S 5/3054* (2013.01); *H01S 5/34353* (2013.01)

(56) References Cited

FOREIGN PATENT DOCUMENTS

| | | | |
|---|---|---|---|
| CN | 110335844 A | * | 10/2019 |
| JP | 2018054769 | | 4/2018 |

* cited by examiner

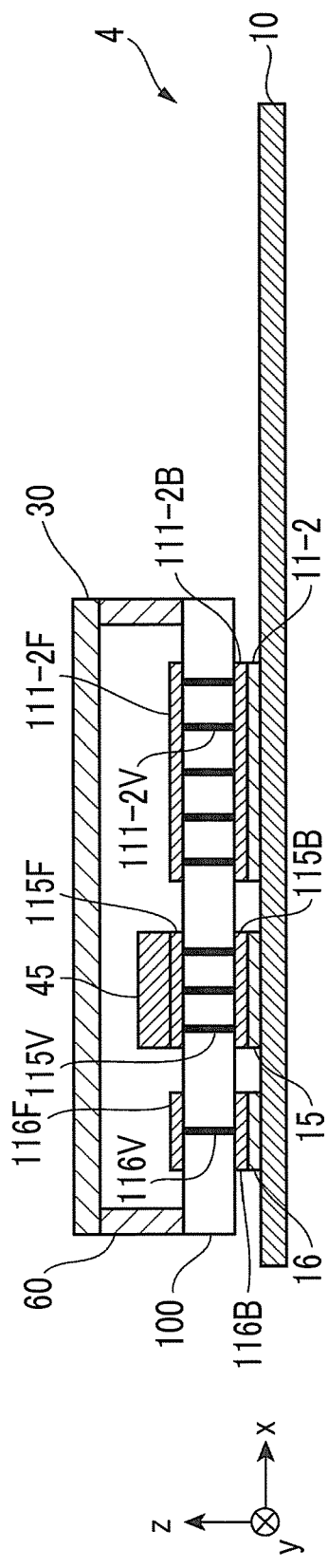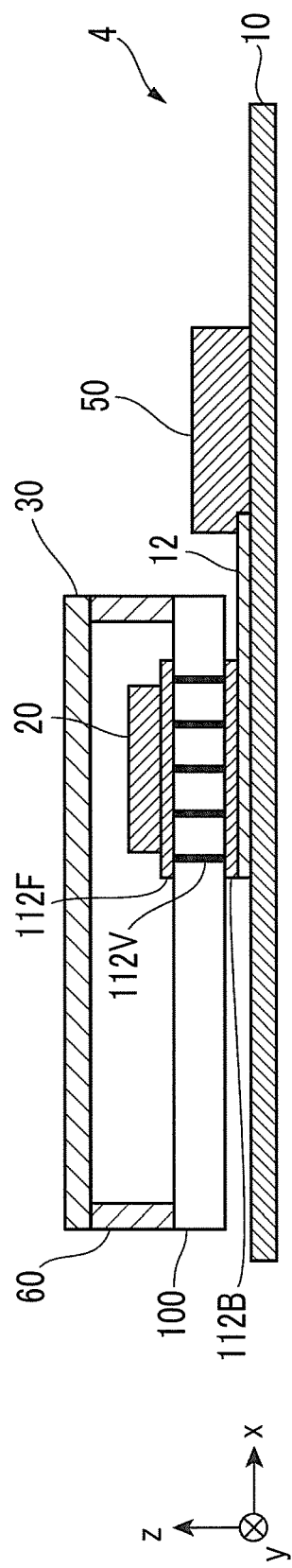

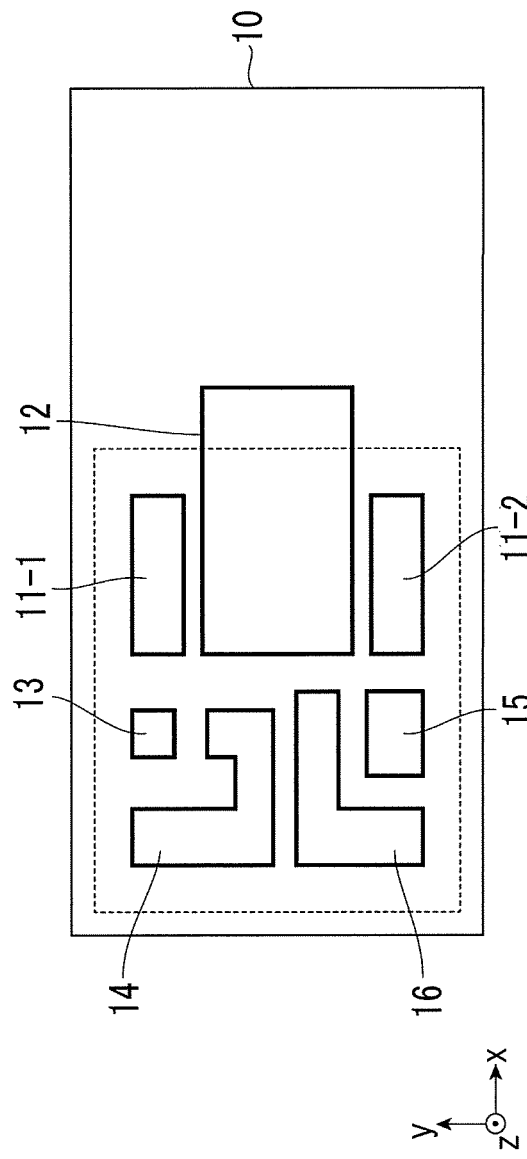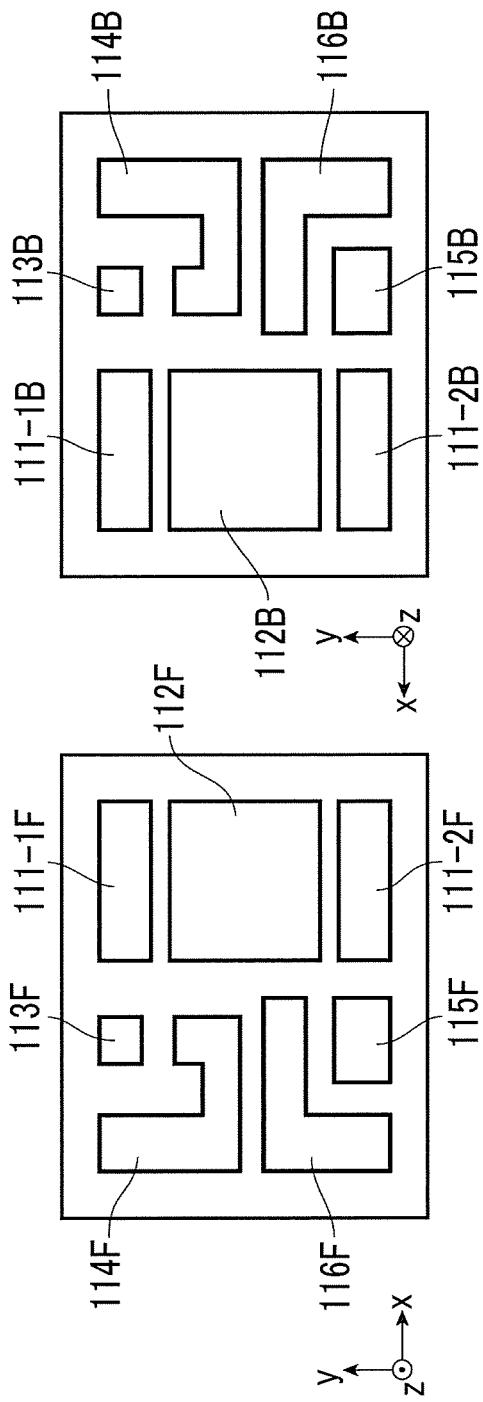

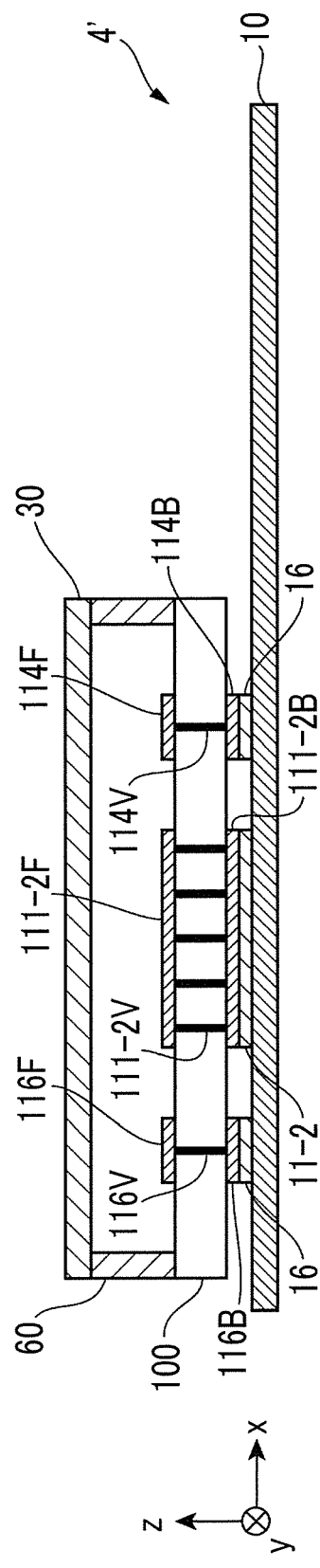
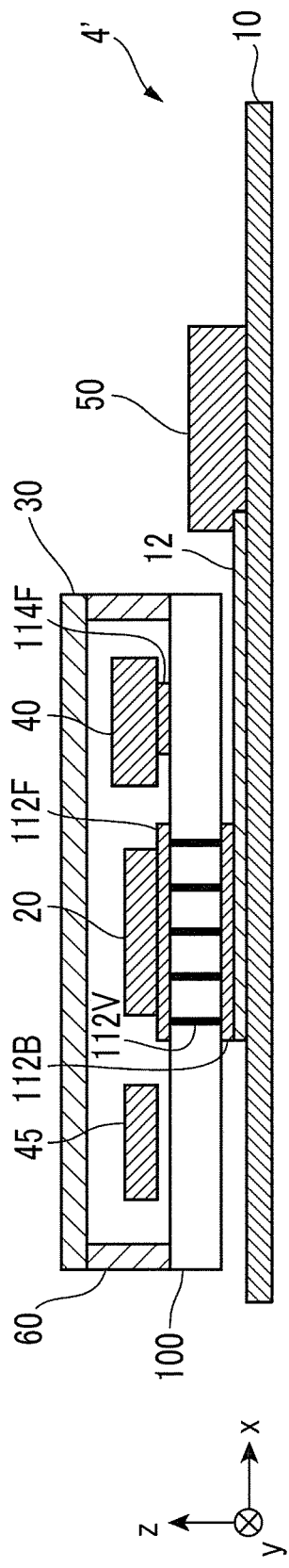

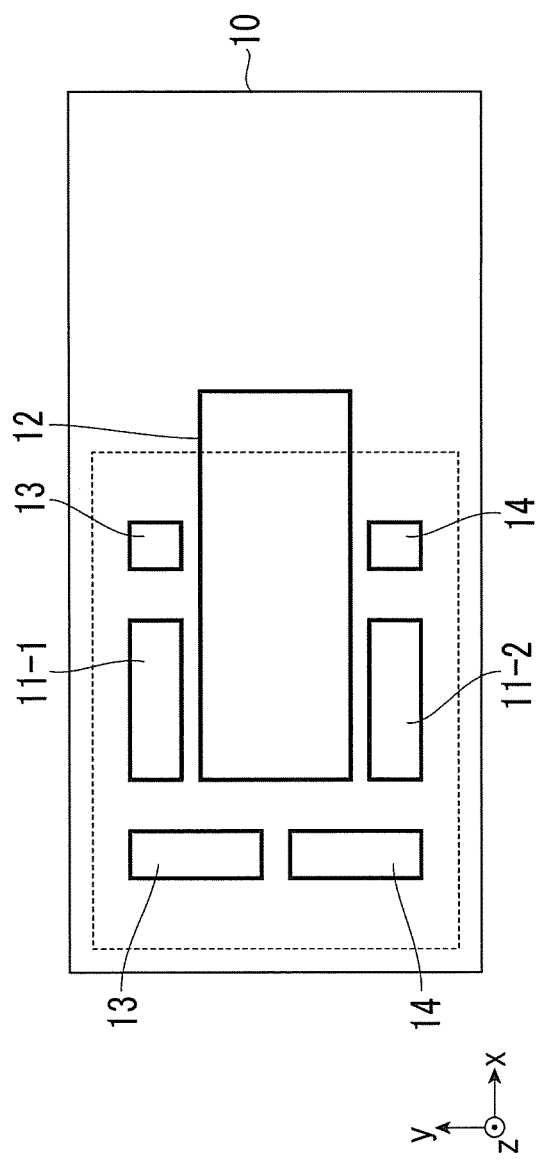
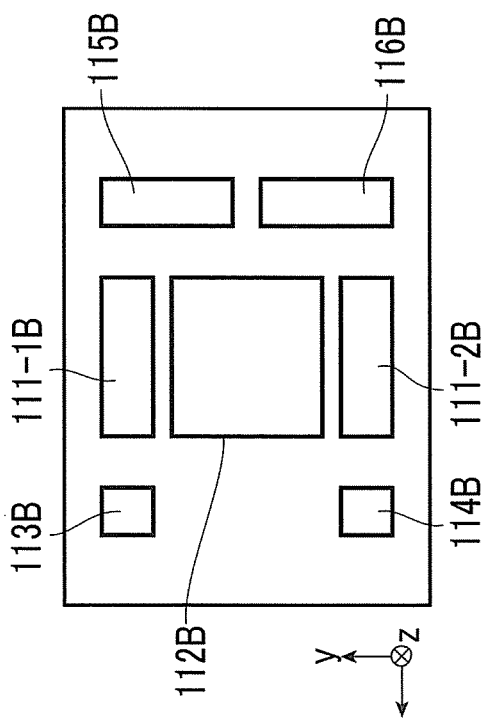
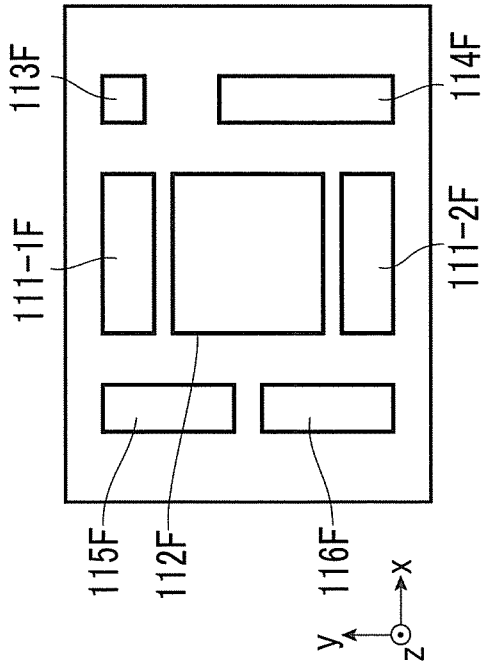

LIGHT EMITTING DEVICE, OPTICAL DEVICE, AND INFORMATION PROCESSING APPARATUS

CROSS-REFERENCE TO RELATED APPLICATIONS

This application is based on and claims priority under 35 USC 119 from Japanese Patent Application No. 2019-076837 filed Apr. 15, 2019.

BACKGROUND

(i) Technical Field

The present invention relates to a light emitting device, an optical device, and an information processing apparatus.

(ii) Related Art

JP2018-054769A discloses an imaging device that includes a light source, a light diffusion member, an imaging element. The light diffusion member includes a plurality of lenses arranged to be adjacent to each other in a predetermined plane and diffuses light emitted by a light source. The imaging element receives reflection light obtained in a manner that light diffused by the light diffusion member is reflected by a subject. The plurality of lenses are arranged such that a cycle of an interference fringe in the diffused light is equal to or smaller than three pixels.

SUMMARY

For example, reduction of inductance of a circuit that drives a light emitting element array may be desired, that is, wirings such as bonding wires may be provided in a plurality of side surface sides in addition to one side surface side of the light emitting element array. A plurality of circuit elements such as a light receiving element or a temperature detection element may be arranged near to the side surface of the light emitting element array.

In such a case, a configuration in which a plurality of circuit elements are divided to be arranged on a wiring substrate of the driving element side that drives the light emitting element array and a wiring substrate on an opposite side of the driving element with the light emitting element array interposed therebetween, and wirings such as a bonding wire is provided on the remaining side surface side is considered.

However, in a case where the circuit element is disposed between the light emitting element array and the driving element, a path of a wiring pattern for connecting the light emitting element array and the driving element may be limited, and inductance of the circuit may increase.

Aspects of non-limiting embodiments of the present disclosure relate to a light emitting device having a structure of arranging a driving element and a light emitting element array to be near to each other easier than a configuration in which a circuit element is provided on the driving element side of the light emitting element array, an optical device, and an information processing apparatus.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a light emitting device including a wiring substrate, a light emitting element array that includes a first side surface and a second side surface facing each other, and a third side surface and a fourth side surface connecting the first side surface and the second side surface to each other and facing each other, the light emitting element array being provided on the wiring substrate, a driving element that is provided on the wiring substrate on the first side surface side and drives the light emitting element array, a first circuit element and a second circuit element that are provided on the wiring substrate on the second side surface side to be arranged in a direction along the second side surface, and a wiring member that is provided on the third side surface side and the fourth side surface side and extends from a top electrode of the light emitting element array toward an outside of the light emitting element array.

BRIEF DESCRIPTION OF THE DRAWINGS

Exemplary embodiment(s) of the present invention will be described in detail based on the following figures, wherein:

FIG. 5A is a plan view and FIG. 5B is a cross-sectional view taken along line VB-VB in FIG. 5A;

FIGS. 7A to 7C are diagrams illustrating a light emitting device to which the exemplary embodiment is applied, where FIG. 7A is a plan view, FIG. 7B is a cross-sectional view taken along line VIIB-VIIB in FIG. 7A, and FIG. 7C is a cross-sectional view taken along line VIIC-VIIC in FIG. 7A;

FIGS. 8A to 8C are diagrams illustrating a wiring pattern provided on a wiring substrate and a base member in the light emitting device to which the exemplary embodiment is applied, where FIG. 8A illustrates a front surface of the wiring substrate, FIG. 8B illustrates a front surface of the base member, and FIG. 8C illustrates a back surface of the base member;

FIGS. 9A to 9C are plan views illustrating a light emitting device for comparison, where FIG. 9A is a plan view, FIG. 9B is a cross-sectional view taken along line IXB-IXB in FIG. 9A, and FIG. 9C is a cross-sectional view taken along line IXC-IXC in FIG. 9A; and FIGS. 10A to 10C are diagrams illustrating a wiring pattern provided on a wiring substrate and a base member in the light emitting device for the comparison, where FIG. 10A illustrates a front surface of the wiring substrate, FIG. 10B illustrates a front surface of the base member, and FIG. 10C illustrates a back surface of the base member.

DETAILED DESCRIPTION

Hereinafter, an exemplary embodiment of the present invention will be described in detail with reference to the accompanying drawings.

An information processing apparatus recognizes whether or not a user who accesses the information processing apparatus takes a permission for the access. In many cases, only in a case where it is authenticated that the user is a user taking the permission for the access, using the information processing apparatus being the own apparatus is permitted. Until now, a method of authenticating a user with a password, a fingerprint, an iris, or the like has been used. In recent years, an authentication method having higher security has been required. As this method, authentication by a three-dimensional image, for example, an image of the shape of the face of a user, is performed.

Here, an example in which the information processing apparatus is a portable information processing terminal will be described, and descriptions will be made on the assumption that the user is authenticated by recognizing the shape of a face, which is captured as a three-dimensional image. The information processing apparatus may be applied to an information processing apparatus such as a personal computer (PC) other than the portable information processing terminal.

Further, the configuration, the function, the method, and the like described in the exemplary embodiment may be applied to recognition using a three-dimensional shape other than facial shape recognition, as a measurement target. That is, the exemplary embodiment may be applied to recognition of the shape of an object other than a face. The distance to the measurement target is not a problem.

Information Processing Apparatus 1

Figure 1:
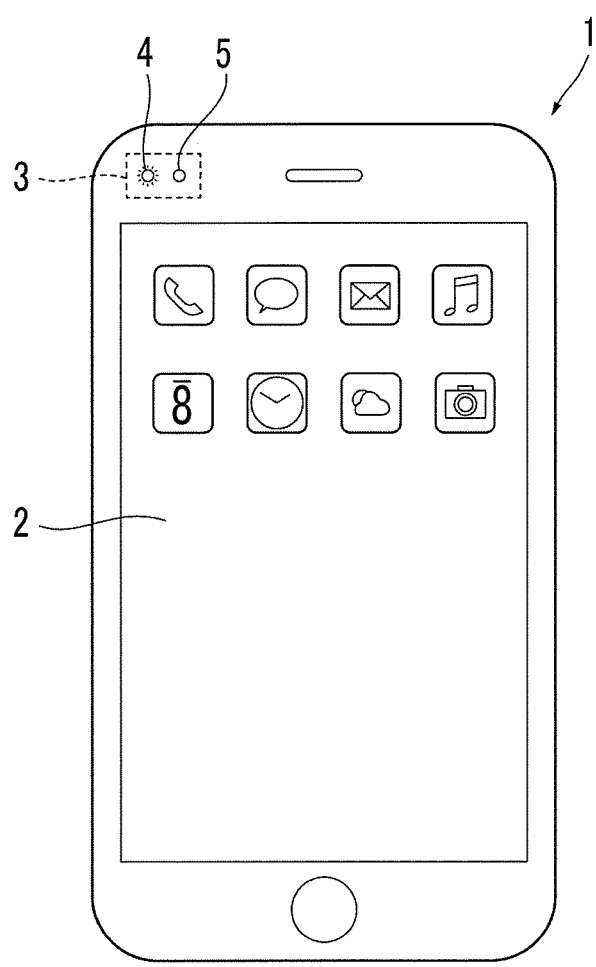
FIG. 1 is a diagram illustrating an example of an information processing apparatus.

FIG. 1 is a diagram illustrating an example of an information processing apparatus 1. As described above, the information processing apparatus 1 is a portable information processing terminal as an example.

The information processing apparatus 1 includes a user interface unit (described as a UI unit below) 2 and an optical device 3 that acquires a three-dimensional image. The UI unit 2 is configured, for example, by integrating a display device and an input device. The display device displays information to a user. The input device receives an input of an instruction for information processing by an operation of a user. The display device is, for example, a liquid crystal display or an organic EL display. The input device is, for example, a touch panel.

The optical device 3 includes a light emitting device 4 and a three-dimensional sensor (described as a 3D sensor below) 5. The light emitting device 4 irradiates a measurement target (face in the example described here) for acquiring a three-dimensional image with light. The 3D sensor 5 acquires light which has been reflected by the face subjected to irradiation of the light emitting device 4, and then comes back. Here, it is assumed that a three-dimensional image of a face is acquired based on the flight time of light, that is, a so-called time-of-flight (ToF) method. Even in a case of acquiring a three-dimensional image of a face, the face is described below as the measurement target. A three-dimensional image using an object other than the face as the measurement target may be acquired. Acquiring a three-dimensional image may be referred to as 3D sensing. The 3D sensor 5 is an example of a light receiving unit.

The information processing apparatus 1 is configured as a computer including a CPU, a ROM, a RAM, and the like. The ROM includes a nonvolatile rewritable memory such as a flash memory. The programs and constants stored in the ROM are developed in the RAM and are executed by the CPU, and thereby the information processing apparatus 1 operates to perform various kinds of various information processing.

Figure 2:
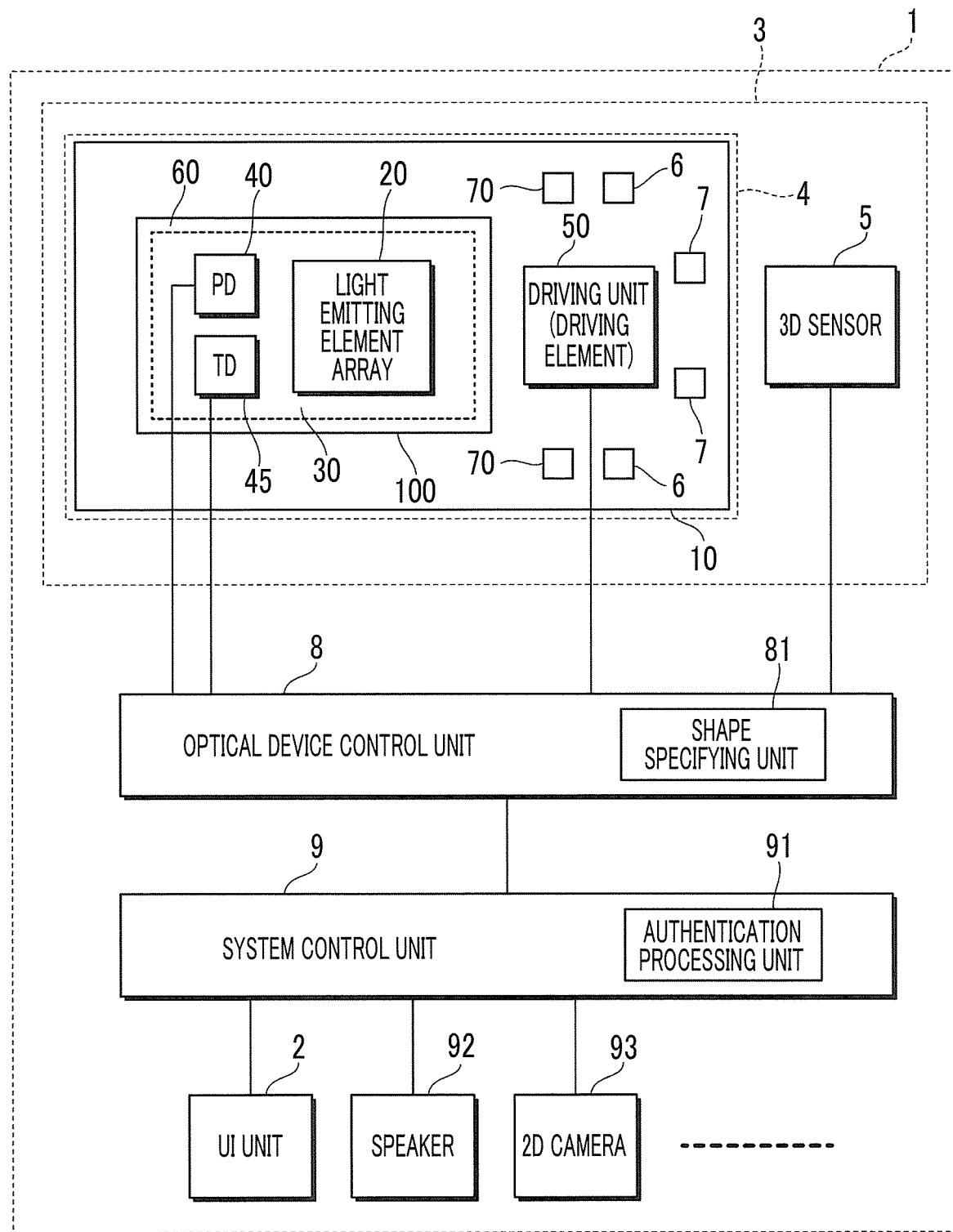
FIG. 2 is a block diagram illustrating a configuration of the information processing apparatus.

FIG. 2 is a block diagram illustrating a configuration of the information processing apparatus 1.

The information processing apparatus 1 includes the optical device 3, an optical device control unit 8, and a system control unit 9. The optical device control unit 8 controls the optical device 3. The optical device control unit 8 includes a shape specifying unit 81. The system control unit 9 controls the entirety of the information processing apparatus in a system. The system control unit 9 includes an authentication processing unit 91. The UI unit 2, a speaker 92, a two-dimensional camera (described as a 2D camera in FIG. 2) 93, and the like are connected to the system control unit 9.

Descriptions Will Be Made Below in Order

The light emitting device 4 in the optical device 3 includes a wiring substrate 10, a base member 100, a light emitting element array 20, a light diffusion member 30, a light receiving element 40 for monitoring the light quantity (described as PD in FIG. 2), a temperature detection element (described as a TD in FIG. 2 and the following descriptions) 45, a driving unit 50, a holding unit 60, and a capacitor 70. The light emitting device 4 further includes a passive element such as a resistance element 6 and a capacitor 7, in order to operate the driving unit 50. The driving unit 50 includes a driving element that drives the light emitting element array 20, as will be described later. In FIG. 2, the driving unit 50 is denoted as a driving unit (driving element). Two capacitors 70 are illustrated. However, one capacitor may be provided, or capacitors more than two may be provided. A plurality of resistance elements 6 and a plurality of capacitors 7 may be provided. Here, the capacitor 70, the 3D sensor 5, the resistance element 6, the capacitor 7, and the like in addition to the light emitting element array 20, the PD 40, the TD 45, and the driving unit 50 may be described as circuit components without distinguishing from each other.

The light emitting element array 20, the PD 40, and the TD 45 are provided on the base member 100. The base member 100 is made of an electrically insulating member. The base member 100, the driving unit 50, the capacitor 70, the resistance element 6, and the capacitor 7 are provided on the wiring substrate 10. That is, the light emitting element array 20, the PD 40, and the TD 45 are provided on the wiring substrate 10 with the base member 100 interposed therebetween. Here, even in a case where the base member 100 is interposed, the light emitting element array 20, the PD 40, and the TD 45 are provided on the wiring substrate 10. The driving unit 50 is configured by a semiconductor integrated circuit as an example.

The light emitting element array 20 is configured as an array in which a plurality of light emitting elements are two-dimensionally arranged (see FIG. 3 described later). The light emitting element is, for example, a vertical cavity surface emitting laser (VCSEL) element. The following descriptions will be made on the assumption that the light emitting element is a vertical cavity surface emitting laser element (VCSEL). The vertical cavity surface emitting laser element VCSEL is described as a VCSEL. The light emitting element array 20 emits light in a vertical direction to the front surface of the wiring substrate 10 or the base member 100. In a case where three-dimensional sensing is performed by a ToF method, for example, the light emitting element array 20 is required to emit pulsed light (described as an emitted light pulse below) having a frequency of 100 MHz or more and a rising time of 1 ns or shorter. In a case where face authentication is used as an example, the distance of applied light is about 10 cm to about 1 m. A range for measurement as a 3D shape is about 1 m square. The distance at which irradiation with light is performed is described as a measurement distance. The range in which the 3D shape of a measurement target is measured is described as a measurement range or an irradiation range. A surface which is virtually provided in the measurement range or the irradiation range is referred to as an irradiation surface.

The PD 40 is, for example, a pin-type photodiode which outputs an electrical signal depending on the quantity of received light (described as a received light quantity below) and is configured with a p-type Si region serving as an anode, an i (intrinsic) type Si region, and an n-type Si region serving as a cathode. An anode electrode is provided in the p-type Si region. A cathode electrode is provided in the n-type Si region. The PD 40 is an example of a first circuit element and is an example of a light receiving element.

The TD 45 is a temperature detection element that detects the temperature of the base member 100. The TD 45 is, for example, a surface mount type negative temperature coefficient thermistor (NTC) or a surface mount type positive temperature coefficient thermistor (PTC) The resistance value of the negative temperature coefficient thermistor decreases in a case where the temperature rises. The resistance value of the positive temperature coefficient thermistor increases rapidly in a case where the detected temperature exceeds a predetermined temperature. The temperature of the base member 100 is detected by using the above-described characteristics of the TD 45, and the temperature of the light emitting element array 20 is indirectly monitored. The TD 45 may be disposed near the light emitting element array 20. The thermistor has no polarity, but some other temperature sensor elements have polarity. The TD 45 is an example of a second circuit element.

The light diffusion member 30 is provided to cover the light emitting element array 20 and the PD 40. That is, the light diffusion member 30 is provided to be spaced at a predetermined distance from the light emitting element array 20 and the PD 40 on the base member 100, by the holding unit 60 provided on the base member 100. The phase that the light diffusion member 30 covers the light emitting element array 20 and the PD 40 means that the light diffusion member 30 is provided on an emission path of light emitted by the light emitting element array 20 and is provided to cause light emitted by the light emitting element array 20 to be transmitted through the light diffusion member 30. In a case of being viewed in plan view, the above phase means a state where the light emitting element array 20 and the PD 40 overlap the light diffusion member 30. Here, the plan view indicates a case of being viewed in an xy plane in FIGS. 3, 7A, and the like described later. The PD 40 may be disposed at a position which is covered by the light diffusion member 30 and is near to the light emitting element array 20, so as to easily receive a portion of light reflected by the light diffusion member 30 in light emitted by the light emitting element array 20. In FIG. 2, the light diffusion member 30 is provided to cover the TD 45. However, the light diffusion member 30 may not cover the TD 45. In a case where the light diffusion member 30 is set not to cover the TD 45, the area of the expensive light diffusion member 30 may be reduced.

The holding unit 60 is provided at a peripheral portion of the light diffusion member 30 to hold the light diffusion member 30. Here, the holding unit 60 is provided to surround the light emitting element array 20, the PD 40, and the TD 45. Here, it is assumed that the outer shape of the base member 100, the outer shape of the light diffusion member 30, and the outer shape of the holding unit 60 are identical to each other. Therefore, outer edges of the base member 100, the light diffusion member 30, and the holding unit 60 overlap each other. The outer shape of the base member 100 may be larger than the outer shape of the light diffusion member 30 or the outer shape of the holding unit 60.

Details of the wiring substrate 10, the base member 100, the light emitting element array 20, the light diffusion member 30, the driving unit 50, and the holding unit 60 in the light emitting device 4 will be described later.

The 3D sensor 5 includes a plurality of light receiving cells. For example, each of the light receiving cells is configured to receive pulsed reflection light (described as received light pulse below) from a measurement target with respect to the emitted light pulse from the light emitting element array 20 and to accumulate charges corresponding to a time to receive light, for each light receiving cell. The 3D sensor 5 is configured by a CMOS structure device in which each light receiving cell includes two gates and charge accumulation units corresponding to the gates. Pulses are alternately applied to the two gates, and thereby generated photoelectrons are transferred to one of the two charge accumulation units at a high speed. Charges depending on a phase difference between the emitted light pulse and the received light pulse are accumulated in the two charge accumulation units. The 3D sensor 5 outputs a digital value depending on the phase difference between the emitted light pulse and the received light pulse for each light receiving cell, through an AD converter in a form of a signal. That is, the 3D sensor 5 outputs a signal corresponding to a time from emission of light from the light emitting element array 20 until the light is received by the 3D sensor 5. The AD converter may include the 3D sensor 5 or may be provided outside the 3D sensor 5.

As described above, in a case using face authentication as an example, the light emitting element array 20 is required to irradiate the irradiation range with light. The irradiation range is at a distance of about 10 cm to about 1 m and has about 1 m square. A 3D shape of the measurement target is measured in a manner that the 3D sensor 5 receives reflection light from the measurement target. Therefore, the light emitting element array 20 is required to perform a high output and to dissipate heat generated from the light emitting element array 20 with high efficiency, and is required to suppress overheating of the light emitting element array 20.

The shape specifying unit 81 in the optical device control unit 8 acquires the digital value obtained from the 3D sensor 5 for each light receiving cell and calculates a distance to the measurement target for each light receiving cell. The 3D shape of the measurement target is specified by the calculated distance.

In a case where the 3D shape of the measurement target as a specification result obtained by the shape specifying unit 81 performing specifying is a 3D shape which has been stored in a ROM or the like, the authentication processing unit 91 in the system control unit 9 performs authentication processing for using the information processing apparatus 1. The authentication processing for using the information processing apparatus 1 refers to processing of determining whether or not using of the information processing apparatus 1 as the own apparatus is permitted, as an example. For example, in a case where it is determined that the 3D shape of a face as a measurement target is identical to a face shape stored in a storage member such as the ROM, using of the information processing apparatus 1 is permitted with including various applications and the like to be provided by the information processing apparatus 1.

The shape specifying unit 81 and the authentication processing unit 91 are configured by programs as an example. The shape specifying unit 81 and the authentication processing unit 91 may be configured by integrated circuits such as an ASIC and an FPGA. The shape specifying unit 81 and the authentication processing unit 91 may be configured by software such as a program and an integrated circuit such as an ASIC.

In FIG. 2, the optical device 3, the optical device control unit 8, and the system control unit 9 are separately illustrated. However, the system control unit 9 may include the optical device control unit 8. The optical device control unit 8 may be included in the optical device 3. The optical device 3, the optical device control unit 8, and the system control unit 9 may be integrally configured.

Next, before the light emitting device 4 is described, circuits that drive the light emitting element array 20, the light diffusion member 30, and the light emitting element array 20 constituting the light emitting device 4 will be described. The circuit that drives the light emitting element array 20 includes the driving unit 50, the capacitor 70, the PD 40, and the TD 45.

Configuration of Light Emitting Element Array 20

Figure 3:
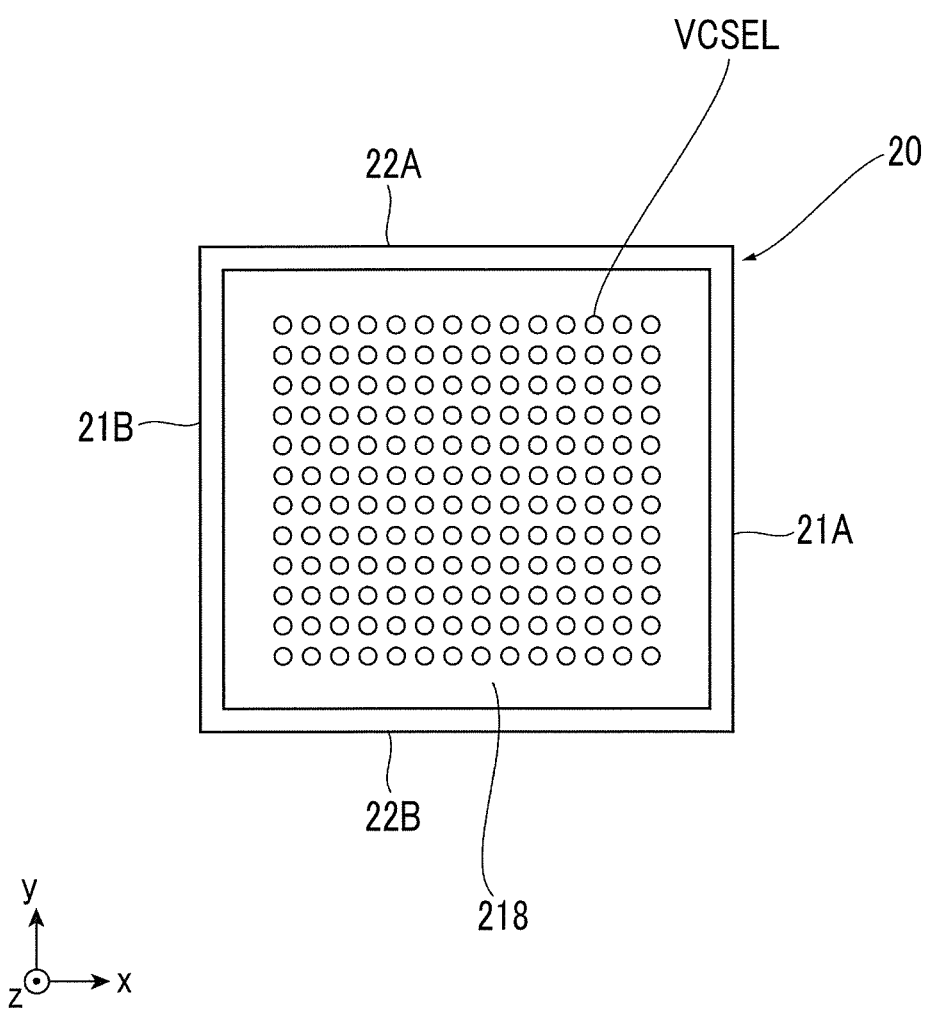
FIG. 3 is a plan view illustrating a light emitting element array.

FIG. 3 is a plan view illustrating the light emitting element array 20. The planar shape of the light emitting element array 20, which is a shape obtained in plan view, is a quadrangle. The light emitting element array 20 is configured by arranging a plurality of VCSELs in a two-dimensional array. A rightward direction of the paper surface is set to an x-direction, and an upward direction of the paper surface is set to a y-direction. A direction orthogonal to the x-direction and the y-direction in a counterclockwise direction is set to a z-direction. The x-direction, the y-direction, and the z-direction are common in the drawings. The front surface refers to a surface on a +z direction side, and the back surface refers to a surface on a −z direction side. The above descriptions are similarly applied to other cases. It is not necessarily required that the plurality of VCSELs are arranged at intersections of lattices as illustrated in FIG. 3. The VCSELs may be arranged in other forms, for example, the VCSELs may be arranged at vertices of a plurality of triangles provided to be adjacent to each other.

The VCSEL is a light emitting element in which an active region as a light emission region is provided between a lower multilayer reflector and an upper multilayer reflector stacked on a semiconductor substrate 200 (see FIG. 4 described later), and a laser beam is emitted in the +z direction being the vertical direction of the semiconductor substrate 200. With such a configuration, a two-dimensional array is easily made. The number of VCSELs in the light emitting element array 20 is 100 to 1000 as an example. The plurality of VCSELs are connected in parallel to each other and are driven in parallel. The number of VCSELs is an example. The number of VCSELs in the light emitting element array 20 may be set in accordance with the measurement distance or the measurement range.

An anode electrode 218 (see FIG. 4 described later) which is common between the plurality of VCSELs is provided on the front surface of the light emitting element array 20. A cathode electrode 214 is provided on the back surface of the light emitting element array 20 (see FIG. 4 described later). That is, the plurality of VCSELs are connected in parallel to each other. Since the plurality of VCSELs are connected in parallel to each other and drive, light having intensity stronger than that in a case where the VCSELs drive individually is emitted simultaneously, and is applied to the measurement target.

Here, a side surface of the light emitting element array 20 (having a quadrangular planar shape) on the +x direction side is described as a side surface 21A. A side surface of the light emitting element array on the −x direction side is described as a side surface 21B. A side surface of the light emitting element array on the +y direction side is described as a side surface 22A. A side surface of the light emitting element array on the −y direction side is described as a side surface 22B. The side surface 21A faces the side surface 21B. The side surface 22A and the side surface 22B face each other while connecting the side surface 21A and the side surface 21B. Here, the side surface 21A is an example of a first side surface. The side surface 21B is an example of a second side surface. The side surface 22A is an example of a third side surface. The side surface 22B is an example of a fourth side surface.

Structure of VCSEL

Figure 4:
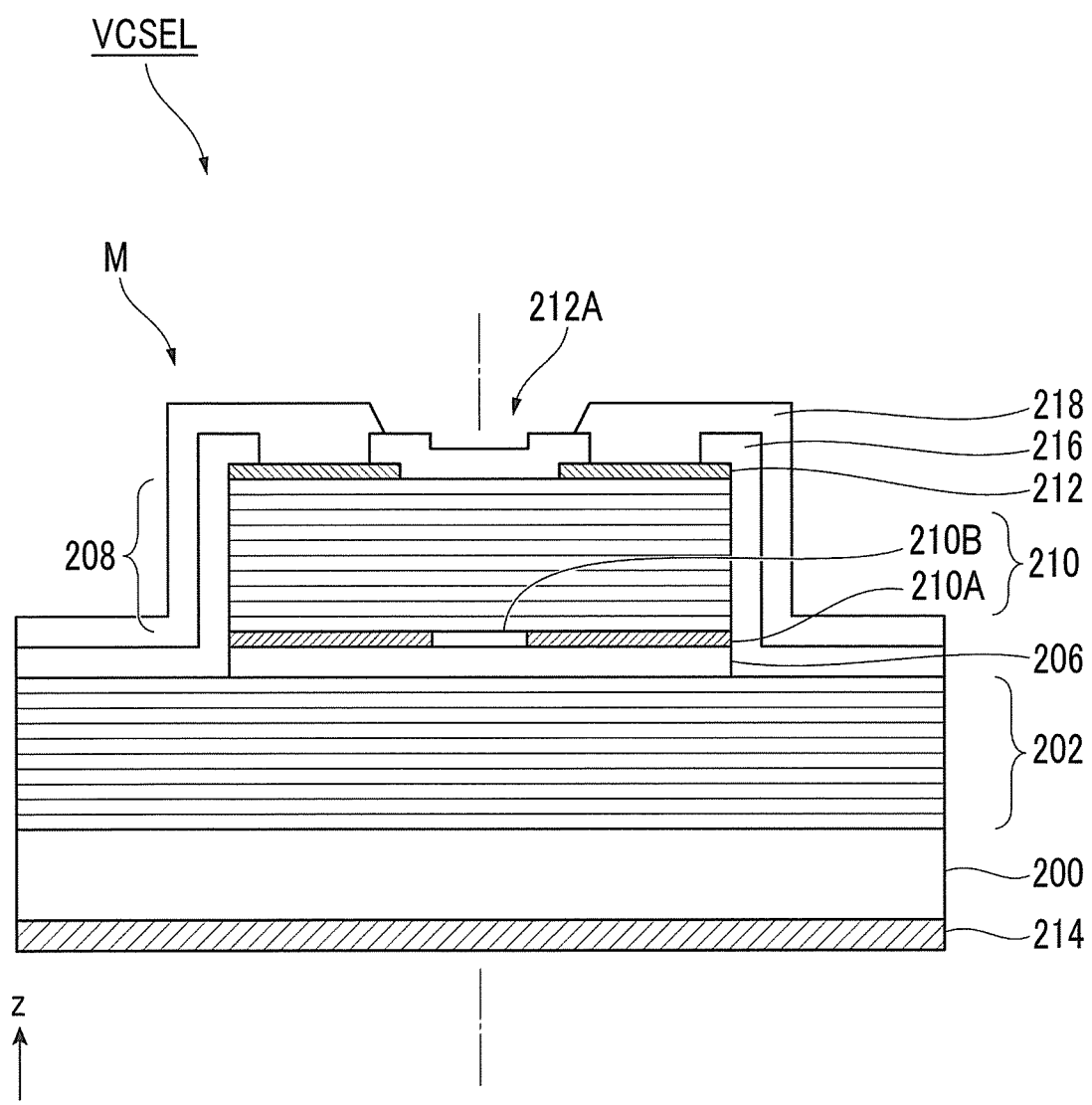
FIG. 4 is a diagram illustrating a cross-sectional structure of one VCSEL in the light emitting element array.

FIG. 4 is a diagram illustrating a cross-sectional structure of one VCSEL in the light emitting element array 20. The VCSEL is a VCSEL having a $\lambda$ resonator structure. The upward direction of the paper surface is set to a z-direction.

The VCSEL is configured in a manner that an n-type lower distributed Bragg reflector (DBR) 202, an active region 206, and a p-type upper distributed Bragg reflector 208 are sequentially stacked on, for example, the n-type GaAS semiconductor substrate 200. In the lower distributed Bragg reflector, AlGaAs layers having different Al compositions are alternately stacked. The active region 206 includes a quantum well layer interposed between an upper spacer layer and a lower spacer layer. In the upper distributed Bragg reflector, AlGaAs layers having different Al compositions are alternately stacked. The distributed Bragg reflector will be described as a DBR below.

The n-type lower DBR 202 is a stacked body in which an $Al_{0.9}Ga_{0.1}As$ layer and a GaAs layer are paired. The thickness of each layer is $\lambda/4\, n_r$ ($\lambda$ indicates an oscillation wavelength, and $n_r$ indicates a refractive index of a medium). The $Al_{0.9}Ga_{0.1}As$ layers and the GaAs layers are alternately stacked in 40 cycles. The carrier concentration after doping silicon, which is an n-type impurity, is, for example, $3\times10^{18}$ cm$^{-3}$.

The active region 206 is configured by stacking a lower spacer layer, a quantum well active layer, and an upper spacer layer. For example, the lower spacer layer is an undoped $Al_{0.6}Ga_{0.4}As$ layer. The quantum well active layer is an undoped InGaAs quantum well layer and an undoped GaAs barrier layer. The upper spacer layer is an undoped $Al_{0.6}Ga_{0.4}As$ layer.

The p-type upper DBR 208 is a stacked body in which a p-type $Al_{0.9}Ga_{0.1}As$ layer and a GaAs layer are paired. The thickness of each layer is $\lambda/4\, n_r$. The $Al_{0.9}Ga_{0.1}As$ layers and the GaAs layers are alternately stacked in 29 cycles. The carrier concentration after doping carbon, which is a p-type impurity, is, for example, $3\times10^{18}$ cm$^{-3}$. For example, preferably, a contact layer formed of p-type GaAs is formed on the top layer of the upper DBR 208, and a p-type AlAs current confinement layer 210 is formed on or in the bottom layer of the upper DBR 208.

A cylindrical mesa M is formed on the semiconductor substrate 200 by etching semiconductor layers stacked from the upper DBR 208 to the lower DBR 202. Thus, the current confinement layer 210 is exposed to the side surface of the mesa M. With an oxidation process, an oxidized region 210A obtained by oxidizing the side surface of the mesa M and a conductive region 210B surrounded by the oxidized region 210A are formed in the current confinement layer 210. In the oxidation process, an oxidation speed of the AlAs layer is slower than the oxidation speed of the AlGaAs layer, and the oxidized region 210A is oxidized inward from the side surface of the mesa M at a substantially constant speed. Thus, the planar shape of the conductive region 210B is a shape obtained by reflecting the outer shape of the mesa M, that is, a circular shape. The center of the oxidized region substantially coincides with an axis direction of the mesa M, which is indicated by a one dot chain line. In the exemplary embodiment, the mesa M has a columnar structure.

A metal annular p-side electrode 212 in which Ti/Au and the like are stacked is formed on the top layer of the mesa M. The p-side electrode 212 is in ohmic contact with the contact layer provided in the upper DBR 208. The surface of the upper DBR 208 on an inner side of the annular p-side electrode 212 acts as a light emission port 212A through which a laser light is emitted to the outside thereof. That is, in the VCSEL, light is emitted in a direction perpendicular to the semiconductor substrate 200, and the axis direction of the mesa M serves as an optical axis. The cathode electrode 214 is formed on the back surface of the semiconductor substrate 200, as an n-side electrode. The surface of the upper DBR 208 on an inner side of the p-side electrode 212 is a light emission surface. That is, the optical axis direction of the VCSEL serves as a light emission direction.

An insulating layer 216 is provided to cover the surface of the mesa M except for a portion of the p-side electrode 212, which is connected to the anode electrode (anode electrode 218 described later) and the light emission port 212A. The anode electrode 218 is provided to come into ohmic contact with the p-side electrode 212 except for the light emission port 212A. The anode electrode 218 is commonly provided in the plurality of VCSELs. That is, in the plurality of VCSELs constituting the light emitting element array 20, p-side electrodes 212 are connected in parallel by the anode electrode 218. The anode electrode 218 is an example of the top electrode of the light emitting element array.

The VCSEL may oscillate in a single transverse mode or in a multiple transverse mode.

As an example, an optical output of the one VCSEL is 4 mW to 8 mW. Thus, for example, in a case where the light emitting element array 20 is configured by 500 VCSELs, the optical output of the light emitting element array 20 is 2 W to 4 W. In the light emitting element array 20 with a high output as described above, heat generated from the light emitting element array 20 is large.

Configuration of Light Diffusion Member 30

Figure 5A:
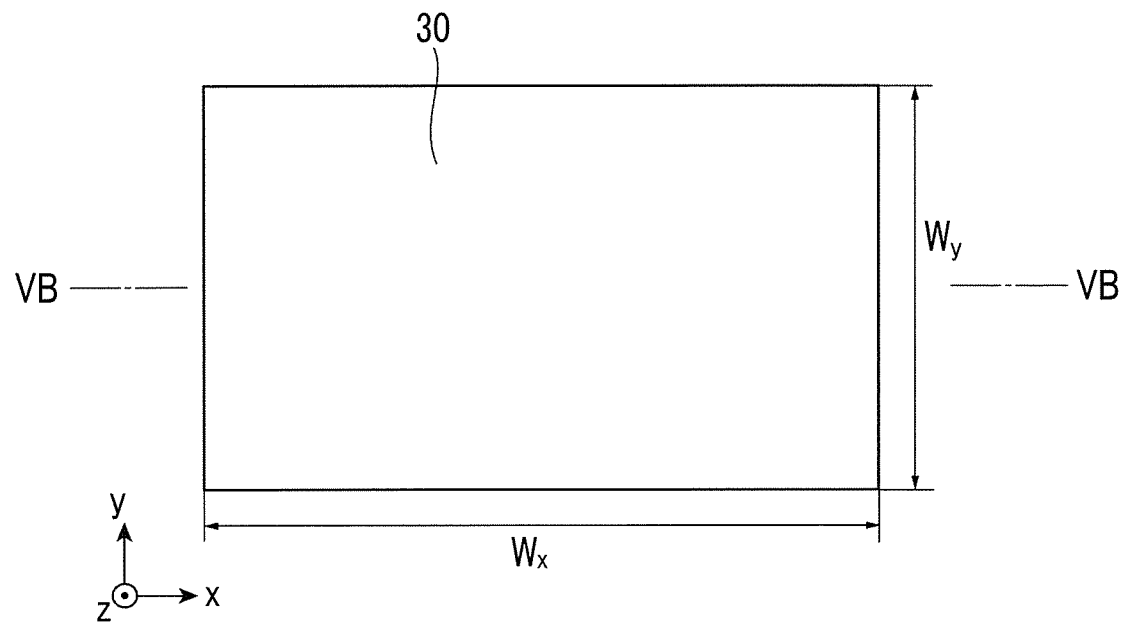
FIGS. 5A and 5B are diagrams illustrating an example of a light diffusion member, where
Figure 5B:
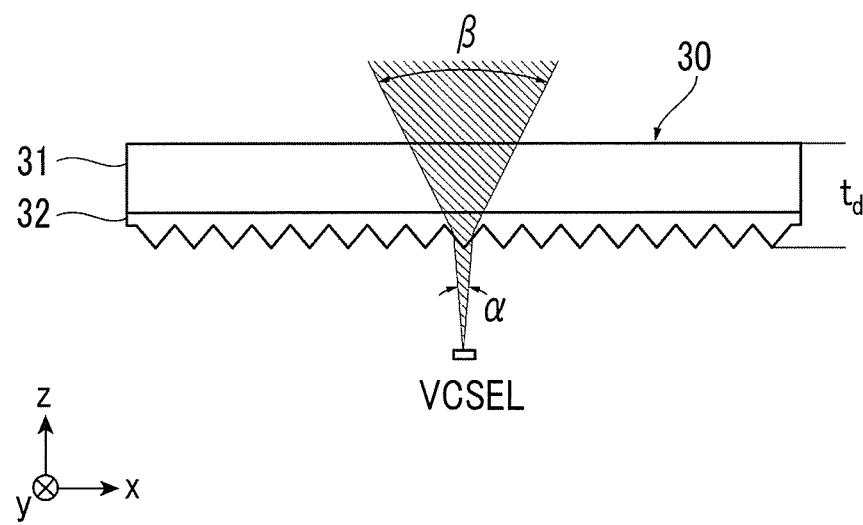

FIGS. 5A and 5B are diagrams illustrating an example of the light diffusion member 30. FIG. 5A is a plan view and FIG. 5B is a cross-sectional view taken along line VB-VB in FIG. 5A. In FIG. 5A, a rightward direction of the paper surface is set to an x-direction, and an upward direction of the paper surface is set to a y-direction. A direction orthogonal to the x-direction and the y-direction in a counterclockwise direction is set to a z-direction. Thus, in FIG. 5B, a rightward direction of the paper surface is set to an x-direction, and an upward direction of the paper surface is set to a z-direction.

As illustrated in FIG. 5B, the light diffusion member 30 includes a flat glass base member 31 and a resin layer 32. The base member 31 has both surfaces which are parallel to each other. The resin layer 32 is provided on the back surface of the glass base member 31. In the resin layer 32, an unevenness for diffusing light is formed. The light diffusion member 30 emits light with a wider spread angle of light incident from the VCSEL of the light emitting element array 20. That is, the unevenness formed in the resin layer 32 of the light diffusion member 30 refracts or scatters light, and increases the spread angle $\beta$ of the emitted light from the spread angle of the incident light. That is, as illustrated in FIG. 5B, the spread angle $\beta$ of light which has been transmitted through the light diffusion member 30 and then emitted from the light diffusion member 30 is larger than the spread angle $\alpha$ of light emitted from the VCSEL ($\alpha<\beta$). Therefore, in a case using the light diffusion member 30, the area of the irradiation surface irradiated with light emitted from the light emitting element array 20 increases in comparison to a case where the light diffusion member 30 is not used. Light density on the irradiation surface decreases. The light density refers to irradiance. The spread angles $\alpha$ and $\beta$ are the full width at half maximum (FWHM).

In the light diffusion member 30, for example, a planar shape is a quadrangular planar shape, a width $W_x$ in the x-direction and a vertical width $W_y$ in the y-direction are set to 1 mm to 10 mm, and a thickness $t_d$ in the z-direction is 0.1 mm to 1 mm. In particle, in a case where the light diffusion member 30 has such a size and a shape as described above, a light diffusion member appropriate for face authentication of a portable information processing terminal and a relatively short distance measurement up to about several meters is provided. The planar shape of the light diffusion member 30 may be other shapes such as a polygon or a circle.

Circuit That Drives Light Emitting Element Array 20

In a case where it is desired to drive the light emitting element array 20 at a higher speed, low-side driving may be provided. Low-side driving means a configuration in which a driving element such as a MOS transistor is located on a downstream side of a current path with respect to a driving target such as the VCSEL. Conversely, high-side driving means a configuration in which the driving element is located on an upstream side of the current path.

Figure 6:
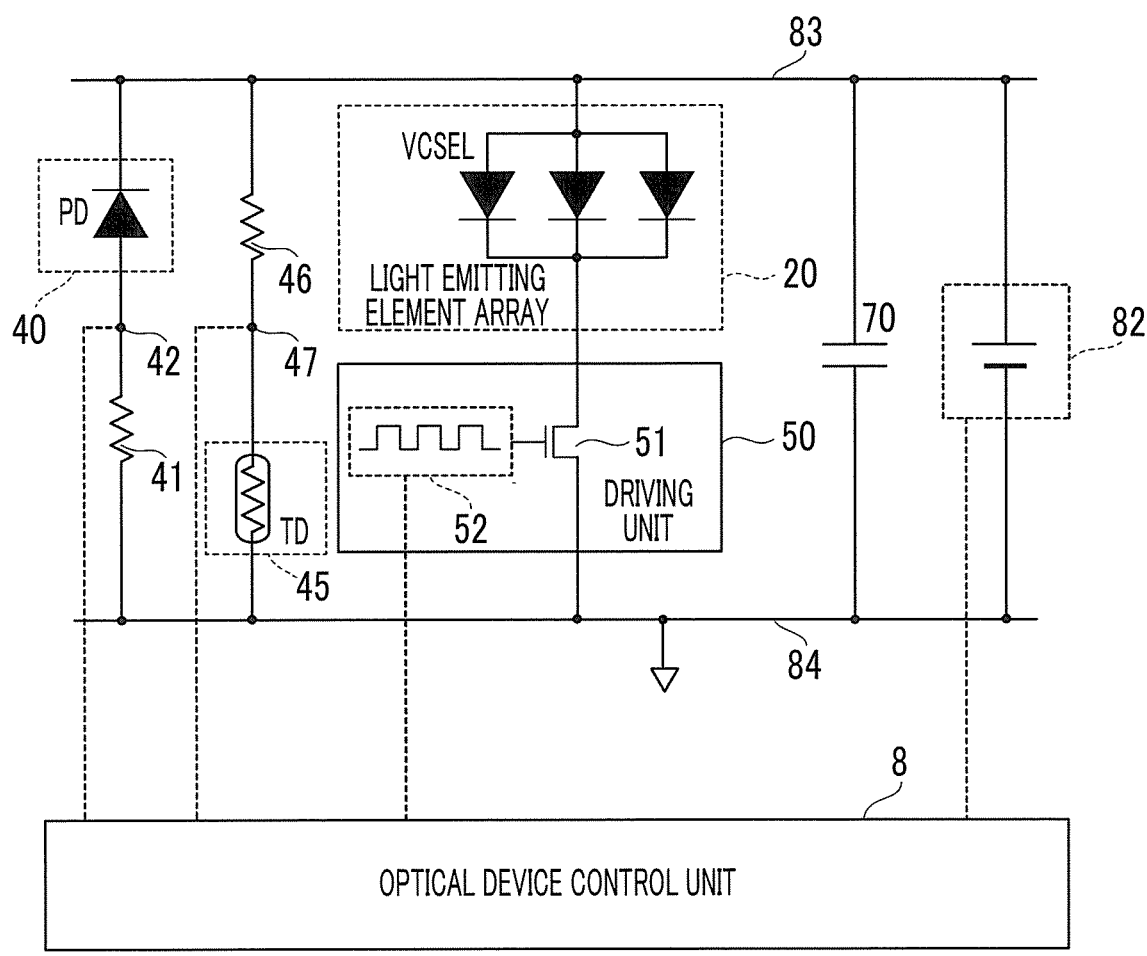
FIG. 6 is a diagram illustrating an example of an equivalent circuit that drives the light emitting element array by low-side driving.

FIG. 6 is a diagram illustrating an example of an equivalent circuit that drives the light emitting element array 20 by the low-side driving. FIG. 6 illustrates the VCSEL of the light emitting element array 20, the driving unit 50, the capacitor 70, a power source 82, the PD 40, a light quantity detection resistance element 41 for detecting a current flowing in the PD 40, the TD 45, and a temperature detection resistance element 46 for detecting a current flowing in the TD 45. The capacitor 70 is connected in parallel to the power source 82.

The power source 82 is provided in the optical device control unit 8 illustrated in FIG. 2. The power source 82 generates a DC voltage in which a positive side is set to a power source potential, and a negative side is set to a ground potential. The power source potential is supplied to a power source line 83. The ground potential is supplied to a ground line 84.

The light emitting element array 20 is configured by connecting the plurality of VCSELs in parallel as described above. The anode electrode 218 (see FIG. 4) of the VCSEL is connected to the power source line 83.

The driving unit 50 includes an n-channel MOS transistor 51 and a signal generation circuit 52 that cause the MOS transistor 51 to turn on and off. The drain of the MOS transistor 51 is connected to the cathode electrode 214 (see FIG. 4) of the VCSEL. The source of the MOS transistor 51 is connected to the ground line 84. The gate of the MOS transistor 51 is connected to the signal generation circuit 52. That is, the VCSEL and the MOS transistor 51 of the driving unit 50 are connected in series between the power source line 83 and the ground line 84. The signal generation circuit 52 generates an "H level" signal and an "L level" signal by control of the optical device control unit 8. The "H level" signal causes the MOS transistor 51 to turn into an ON state. The "L level" signal causes the MOS transistor 51 to turn into an OFF state.

In the capacitor 70, one terminal is connected to the power source line 83, and the other terminal is connected to the ground line 84. That is, the capacitor 70 is connected in parallel to the power source 82. In a case where a plurality of capacitors 70 are provided, the plurality of capacitors 70 are connected in parallel. For example, the capacitor 70 is an electrolytic capacitor or a ceramic capacitor.

In the PD 40, the cathode electrode is connected to the power source line 83, and the anode electrode is connected to one terminal of the light quantity detection resistance element 41. The other terminal of the light quantity detection resistance element 41 is connected to the ground line 84. That is, the PD 40 and the light quantity detection resistance element 41 are connected in series between the power source line 83 and the ground line 84. An output terminal 42 being a connection point between the PD 40 and the light quantity detection resistance element 41 is connected to the optical device control unit 8.

In the temperature detection resistance element 46, one terminal is connected to the power source line 83, and the other terminal is connected to the one electrode of the TD 45. The other electrode of the TD 45 is connected to the ground line 84. That is, the temperature detection resistance element 46 and the TD 45 are connected in series between the power source line 83 and the ground line 84. An output terminal 47 being a connection point between the temperature detection resistance element 46 and the TD 45 is connected to the optical device control unit 8.

Next, a driving method of the light emitting element array 20 in low-side driving will be described.

Firstly, a signal generated by the signal generation circuit 52 in the driving unit 50 is set to the "L level". In this case, the MOS transistor 51 is in the OFF state. That is, a current does not flow between the source and the drain in the MOS transistor 51. Thus, the current does not flow in the VCSELs connected in series. The VCSEL does not emit light.

At this time, the capacitor 70 is charged by the power source 82. That is, the one terminal of the capacitor 70, which is connected to the power source line 83, has the power source potential. The other terminal thereof, which is connected to the ground line 84, has the ground potential. The capacitor 70 accumulates charges determined by capacitance and a power source voltage (=power source potential-ground potential), and a time.

Then, in a case where the signal generated by the signal generation circuit 52 in the driving unit 50 has the "H level", the state of the MOS transistor 51 transitions from the OFF state to the ON state. In a case where such transition is performed, the charges accumulated in the capacitor 70 are discharged, a current flows in the MOS transistor 51 and the VCSEL connected in series, and thus the VCSEL emits light.

In a case where the signal generated by the signal generation circuit 52 in the driving unit 50 has the "L level", the state of the MOS transistor 51 transitions from the ON state to the OFF state. Thus, light emission of the VCSEL is stopped. In a case where light emission of the VCSEL is stopped, accumulation of charges in the capacitor 70 is started again by the power source 82.

As described above, every time the signal output by the signal generation circuit 52 transitions between the "L level" and the "H level", the MOS transistor 51 repeats to ON and OFF, and thus non-light emission (being a state where the light emission of the VCSEL is stopped) and light emission are repeated. That is, a light pulse is emitted from the VCSEL. Repetition of ON and OFF of the MOS transistor 51 may be called as switching. Here, as illustrated in the equivalent circuit in FIG. 6, a current path for the light emitting element array 20, which is configured by the light emitting element array 20, the MOS transistor 51, the capacitor 70, and the like is described as a circuit that drives the light emitting element array 20 or a circuit.

Here, the MOS transistor 51 is an example of a driving element that drives the light emitting element array 20. The driving element may be a field effect transistor or a bipolar transistor in addition to the MOS transistor. That is, the driving unit 50 is configured to include the driving element. Thus, here, the driving unit 50 may be described as the driving element.

Charges (current) may be directly supplied from the power source 82 to the VCSEL without providing the capacitor 70. However, the rising time of light emission of the VCSEL is reduced by rapidly supplying a current to the VCSEL in a manner that charges are accumulated in the capacitor 70, and the accumulated charges are discharged in a case where the MOS transistor 51 transitions from the OFF state to the ON state.

The PD 40 is connected in a reverse direction between the power source line 83 and the ground line 84 through the light quantity detection resistance element 41. Therefore, the current does not flow in a state where irradiation with light is not performed. As described above, in a case where the PD 40 receives a portion of light reflected by the light diffusion member 30 in the light emitted from the VCSEL, a current depending on the received light quantity flows in the PD 40. Thus, the current flowing in the PD 40 is measured in a form of a voltage of the output terminal 42, and an optical output of the light emitting element array 20 is detected. The optical device control unit 8 performs control based on the received light quantity of the PD 40 such that the optical output of the light emitting element array 20 becomes a predetermined optical output. For example, in a case where the optical output of the light emitting element array 20 is smaller than the predetermined optical output, the optical device control unit 8 increases the power source potential of the power source 82 to increase the amount of charges accumulated by the capacitor 70 and to increase the current flowing in the VCSEL. In a case where the optical output of the light emitting element array 20 is larger than the predetermined optical output, the optical device control unit 8 decreases the power source potential of the power source 82 to reduce the amount of charges accumulated by the capacitor 70 and to reduce the current flowing in the VCSEL. In this manner, the optical output of the light emitting element array 20 is controlled.

In a case where the received light quantity of the PD 40 is largely reduced, the light diffusion member 30 may be detached or damaged, and thus light emitted from the light emitting element array 20 may be directly applied to the outside. In such a case, the optical output of the light emitting element array 20 is suppressed by the optical device control unit 8. For example, emission of light from the light emitting element array 20, that is, irradiation of the measurement target with light is stopped.

As described above, the PD 40 is provided to detect the optical output of the light emitting element array 20. Thus, as the PD 40 is disposed farther from the light emitting element array 20, the received light quantity is reduced, and detection sensitivity of the optical output of the light emitting element array 20 is degraded. Therefore, the PD 40 may be disposed near the light emitting element array 20.

The TD 45 is connected in series with the temperature detection resistance element 46 between the power source line 83 and the ground line 84. Thus, a voltage at the output terminal 47 is obtained by dividing a power source voltage (=power source potential−ground potential) into a voltage for the temperature detection resistance element 46 and a voltage for the TD 45. In a case where the TD 45 is, for example, a negative temperature coefficient thermistor (NTC), as described above, the resistance value is reduced as the temperature of the base member 100 increases. In a case where the resistance value is reduced, the voltage at the output terminal 47 is reduced as the temperature of the base member 100 increases. The optical device control unit 8 detects the temperature of the base member 100, that is, the temperature of the light emitting element array 20 from the voltage of the output terminal 47. In a case where the temperature is higher than a predetermined allowable temperature, the operation of the light emitting element array 20 may become unstable, or the light emitting element array 20 may be damaged. Thus, in a case where the optical device control unit 8 detects that the temperature of the light emitting element array 20 is higher than the allowable temperature, from the voltage of the output terminal 47, the optical device control unit 8 controls the driving unit 50 to suppress a current flowing in the light emitting element array 20 or to cut off the current flowing in the light emitting element array 20. In this manner, overheating of the light emitting element array 20 is suppressed.

As described above, the TD 45 is provided to detect the temperature of the light emitting element array 20. Thus, as the TD 45 is disposed farther from the light emitting element array 20, the temperature change of the TD 45 is reduced, and detection sensitivity of the temperature of the light emitting element array 20 is degraded. Therefore, the TD 45 may be disposed near the light emitting element array 20.

That is, the PD 40 and the TD 45 are an example of circuit elements desired to be disposed near the light emitting element array 20.

Light Emitting Device 4

Next, the light emitting device 4 will be described in detail.

Figure 7A:
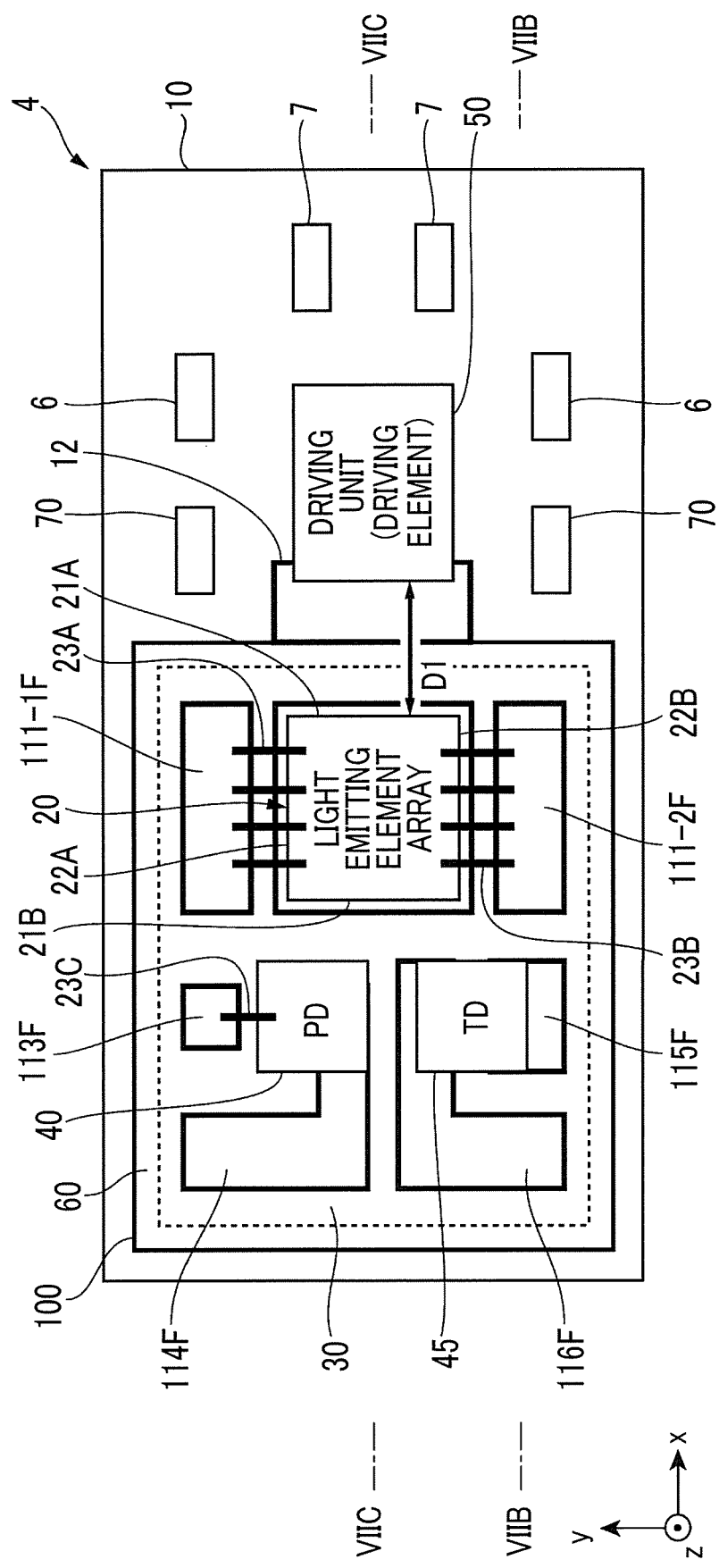

FIGS. 7A to 7C are diagrams illustrating the light emitting device 4 to which the exemplary embodiment is applied. FIG. 7A is a plan view, FIG. 7B is a cross-sectional view taken along line VIIB-VIIB in FIG. 7A, and FIG. 7C is a cross-sectional view taken along line VIIC-VIIC in FIG. 7A. Here, in FIG. 7A, a rightward direction of the paper surface is set to an x-direction, and an upward direction of the paper surface is set to a y-direction. A direction orthogonal to the x-direction and the y-direction in a counterclockwise direction is set to a z-direction. Thus, in FIGS. 7B and 7C, a rightward direction of the paper surface is set to an x-direction, and an upward direction of the paper surface is set to a z-direction. The above descriptions are also applied to the similar drawings.

As illustrated in FIGS. 7B and 7C, in the light emitting device 4, the base member 100 and the driving unit 50 are provided on the wiring substrate 10. The light emitting element array 20, the PD 40, the TD 45, and the holding unit 60 are provided on the base member 100. The light diffusion member 30 is provided on the holding unit 60. As illustrated in FIG. 7A, the light emitting element array 20, the PD 40, and the TD 45 are covered by the light diffusion member 30. Thus, the PD 40 receives a portion of light reflected by the back surface of the light diffusion member 30 in light emitted from the light emitting element array 20. The holding unit 60 may be provided on the wiring substrate 10.

As illustrated in FIG. 7A, in the light emitting device 4, the PD 40 and the TD 45, the light emitting element array 20, and the driving unit 50 are arranged linearly in the x-direction. That is, the driving unit 50 including the MOS transistor 51 (see FIG. 6) as the driving element is provided on the side surface 21A side of the light emitting element array 20. The PD 40 and the TD 45 are provided on the side surface 21B side of the light emitting element array 20. The PD 40 and the TD 45 are provided side by side in a direction along the side surface 21B. That is, the PD 40 and the TD 45 are disposed side by side on the side surface 21B side of the light emitting element array 20 in the y-direction in order of the TD 45 and the PD 40.

With such arrangement, as illustrated in FIG. 7A, a distance D1 from an end portion of the light emitting element array 20 on the driving unit 50 side, that is, from the side surface 21A to an end portion of the driving unit 50 on the light emitting element array 20 side is shorter than a distance D2 in a comparative example (see FIG. 9A described later) which will be described later. A light-emitting-element-array cathode wiring pattern 12 (see FIG. 8A described later) for connecting the cathode electrode 214 of the light emitting element array 20 to the drain (see FIG. 6) of the MOS transistor in the driving unit 50 is provided linearly in the x-direction. Thus, in a case where the distance D1 from the end portion of the light emitting element array 20 on the driving unit 50 side to the driving unit 50 is short, the length of the light-emitting-element-array cathode wiring pattern 12 in the x-direction becomes short. Thus, the inductance of the circuit that drives the light emitting element array 20 is reduced, and thus the light emitting element array 20 is caused to turn ON and OFF at a high speed.

Before the light emitting device 4 is described with reference to the cross-sectional view illustrated in FIGS. 7B and 7C, wiring patterns provided in the wiring substrate 10 and the base member 100 will be described in detail.

FIGS. 8A to 8C are diagrams illustrating a wiring pattern provided on the wiring substrate 10 and the base member 100 in the light emitting device 4 to which the exemplary embodiment is applied. FIG. 8A illustrates the front surface of the wiring substrate 10, FIG. 8B illustrates the front surface of the base member 100, and FIG. 8C illustrates the back surface of the base member 100.

The wiring substrate 10 is a multilayer substrate of three layers, for example. That is, the wiring substrate 10 includes a first conductive layer, a second conductive layer, and a third conductive layer from the front surface side on which the base member 100, the driving unit 50, or the like is mounted. The wiring substrate 10 further includes an insulating layer between the first conductive layer and the second conductive layer and between the second conductive layer and the third conductive layer. For example, the third conductive layer is set to be the power source line 83, and the second conductive layer is set to be the ground line 84.

The first conductive layer, the second conductive layer, and the third conductive layer are made of a conductive material such as metal such as copper (Cu) or silver (Ag) or a conductive paste containing the metal. The insulating layer is made of epoxy resin or ceramic, for example.

FIG. 8A illustrates the wiring pattern by the first conductive layer of the wiring substrate 10. FIG. 8A does not illustrate the second conductive layer being the ground line 84 and the wiring pattern by the third conductive layer being the power source line 83. The second conductive layer and the third conductive layer are solid films except for a portion at which a via used for connection to the wiring pattern configured by the first conductive layer is provided.

As illustrated in FIG. 8A, light-emitting-element-array anode wiring patterns 11-1 and 11-2, a light-emitting-element-array cathode wiring pattern 12, a PD anode wiring pattern 13, a PD cathode wiring pattern 14, a TD anode wiring pattern 15, and a TD cathode wiring pattern 16 are formed by the first conductive layer. The light-emitting-element-array anode wiring patterns and the light-emitting-element-array cathode wiring pattern constitute a portion of a current path for the light emitting element array 20. The PD anode wiring pattern 13 and the PD cathode wiring pattern 14 constitute a portion of a current path for the PD 40. The TD anode wiring pattern 15 and the TD cathode wiring pattern 16 constitute a portion of a current path for the TD 45. In a case where the light-emitting-element-array anode wiring patterns 11-1 and 11-2, the light-emitting-element-array cathode wiring pattern 12, and the like are not distinguished from each other, the wiring patterns are described as a wiring pattern or a wiring. The above descriptions are similarly applied to other cases.

As described above, the configuration is made by using the multilayer substrate as the wiring substrate 10, using the third conductive layer as the power source line 83, and using the second conductive layer as the ground line 84, and thus fluctuations of the power source potential and the ground potential are easily suppressed. The wiring pattern formed by the first conductive layer is electrically connected to the second conductive layer or the third conductive layer through a via. The via refers to, for example, a conductive portion configured in a manner that a hole configured to penetrate the wiring substrate 10 in a thickness direction is buried with a conductive material.

Here, the light-emitting-element-array anode wiring patterns 11-1 and 11-2 refer to wirings connected to the anode electrode 218 of the light emitting element array 20 through the wiring pattern provided in the base member 100. The light-emitting-element-array cathode wiring pattern 12 refers to a wiring in which the cathode electrode 214 of the light emitting element array 20 is connected to the drain of the MOS transistor 51 as an example of the driving element in the driving unit 50 through the wiring pattern provided in the base member 100.

The PD anode wiring pattern 13 refers to a wiring connected to the anode electrode of the PD 40 through the wiring pattern provided in the base member 100. The PD cathode wiring pattern 14 refers to a wiring connected to the cathode electrode of the PD 40 through the wiring pattern provided in the base member 100. The anode electrode and the cathode electrode of the PD 40 are terminals of the PD 40.

The TD anode wiring pattern 15 refers to a wiring connected to one terminal (terminal on the positive side in a case where the polarity is provided) of the TD 45 through the wiring pattern provided in the base member 100. The TD cathode wiring pattern 16 refers to a wiring connected to the other terminal (terminal on the negative side in a case where the polarity is provided) of the TD 45 through the wiring pattern provided in the base member 100.

The wiring patterns connected to circuit components such as the capacitor 70, the resistance element 6, and the capacitor 7 are formed by the first conductive layer. Illustrations of the wiring patterns are omitted.

The planar shape of the light-emitting-element-array cathode wiring pattern 12 is a quadrangle. The light-emitting-element-array anode wiring patterns 11-1 and 11-2 are provided to be adjacent to the light-emitting-element-array cathode wiring pattern 12 on the ±y-direction side such that the light-emitting-element-array anode wiring patterns 11-1 and 11-2 face each other with the light-emitting-element-array cathode wiring pattern 12 interposed therebetween in the ±y-direction.

The PD anode wiring pattern 13 and the PD cathode wiring pattern 14 are provided on the −x direction side of the light-emitting-element-array anode wiring patterns 11-1 and 11-2 and the light-emitting-element-array cathode wiring pattern 12. The PD anode wiring pattern 13 is provided on the +y direction side. The PD cathode wiring pattern 14 is provided to have an L shape bent from the center portion of the wiring substrate 10 toward the +y direction side. That is, the wirings connected to the anode electrode and the cathode electrode of the PD 40 are led to the side surface 22A side of the light emitting element array 20.

The TD anode wiring pattern 15 and the TD cathode wiring pattern 16 are provided on the −x direction side of the light-emitting-element-array anode wiring patterns 11-1 and 11-2 and the light-emitting-element-array cathode wiring pattern 12. The TD anode wiring pattern 15 is provided on the −y direction side. The TD cathode wiring pattern 16 is provided to have an L shape bent from the center portion of the wiring substrate 10 toward the −y direction side. That is, the wirings connected to the two terminals of the TD 45 are led to the side surface 22B side of the light emitting element array 20.

The base member 100 is made of an electrically insulating material. Since the light emitting element array 20 is provided on the base member 100, the base member may be configured by a heat dissipation member which has an electrically insulating property and a heat conductivity higher than a heat conductivity of the wiring substrate 10. Examples of the heat dissipation member having an electrically insulating property include ceramics such as silicon nitride and aluminum nitride. In a case where the base member 100 is configured by the heat dissipation member, it is easy to transfer and dissipate heat generated by the light emitting element array 20 to the holding unit 60 and the light diffusion member 30 through the base member 100, and thus dissipation efficiency is improved.

On the front surface of the base member 100 illustrated in FIG. 8B, light-emitting-element-array anode wiring patterns 111-1F and 111-2F, a light-emitting-element-array cathode wiring pattern 112F, a PD anode wiring pattern 113F, a PD cathode wiring pattern 114F, a TD anode wiring pattern 115F, and a TD cathode wiring pattern 116F are formed. The light-emitting-element-array anode wiring patterns 111-1F and 111-2F, the PD anode wiring pattern 113F, the PD cathode wiring pattern 114F, the TD anode wiring pattern 115F, and the TD cathode wiring pattern 116F except for the light-emitting-element-array cathode wiring pattern 112F have the same planar shapes as the light-emitting-elementarray anode wiring patterns 11-1 and 11-2, the PD anode wiring pattern 13, the PD cathode wiring pattern 14, the TD anode wiring pattern 15, and the TD cathode wiring pattern 16 provided on the wiring substrate 10 illustrated in FIG. 8A, respectively. The light-emitting-element-array cathode wiring pattern 112F has a length in the x-direction, which is shorter than the length of the light-emitting-element-array cathode wiring pattern 12 in the wiring substrate 10. This is because a portion of the light-emitting-element-array cathode wiring pattern 12 on the +x direction side is not covered by the base member 100.

On the back surface of the base member 100 illustrated in FIG. 8C, light-emitting-element-array anode wiring patterns 111-1B and 111-2B, a light-emitting-element-array cathode wiring pattern 112B, a PD anode wiring pattern 113B, a PD cathode wiring pattern 114B, a TD anode wiring pattern 115B, and a TD cathode wiring pattern 116B are formed. The planar shapes of the wiring patterns are shapes obtained by mirror-inverting the light-emitting-element-array anode wiring patterns 111-1F and 111-2F, the light-emitting-element-array cathode wiring pattern 112F, the PD anode wiring pattern 113F, the PD cathode wiring pattern 114F, the TD anode wiring pattern 115F, and the TD cathode wiring pattern 116F formed on the front surface of the base member illustrated in FIG. 8B.

The light-emitting-element-array anode wiring patterns 111-1F and 111-2F, the light-emitting-element-array cathode wiring pattern 112F, the PD anode wiring pattern 113F, the PD cathode wiring pattern 114F, the TD anode wiring pattern 115F, and the TD cathode wiring pattern 116F formed on the front surface of the base member 100 are electrically connected to the light-emitting-element-array anode wiring patterns 111-1B and 111-2B, the light-emitting-element-array cathode wiring pattern 112B, the PD anode wiring pattern 113B, the PD cathode wiring pattern 114B, the TD anode wiring pattern 115B, and the TD cathode wiring pattern 116B formed on the back surface of the base member 100 through a via being a conductive path provided to penetrate the wiring patterns having the same reference number in the thickness direction of the base member 100. As illustrated in FIGS. 7B and 7C, the via is described by adding "V" to the reference number of the wiring pattern. For example, as illustrated in FIG. 7B, the light-emitting-element-array anode wiring pattern 111-2F provided on the front surface is connected to the light-emitting-element-array anode wiring pattern 111-2B provided on the back surface by a via 111-2V. Since a pair of wiring patterns are connected to each other with a plurality of vias, the inductance of the circuit is reduced.

As illustrated in FIG. 7A, the light emitting element array 20, the PD 40, and the TD 45 are mounted on the base member 100.

Firstly, the cathode electrode 214 (see FIG. 4) of the light emitting element array 20 is adhered onto the light-emitting-element-array cathode wiring pattern 112F of the base member 100 by a conductive adhesive or the like. The anode electrode 218 (see FIG. 4) of the light emitting element array 20 is connected to the light-emitting-element-array anode wiring patterns 111-1F and 111-2F by bonding wires 23A and 23B.

The cathode electrode of the PD 40 is adhered onto the PD cathode wiring pattern 114F of the base member 100 by a conductive adhesive. The anode electrode of the PD 40 is connected to the PD anode wiring pattern 113F of the base member 100 by a bonding wire 23C. One terminal (terminal on the positive side in a case where the polarity is provided) of the TD 45 is connected to the TD anode wiring pattern 115F of the base member 100 by a conductive adhesive or a solder. The other terminal (terminal on the negative side in a case where the polarity is provided) of the TD 45 is connected to the TD cathode wiring pattern 116F of the base member 100 by a conductive adhesive or a solder.

The base member 100 is mounted at a position of the wiring substrate 10 in FIG. 8A, which is indicated by being surrounded with a broken line. Thus, the light-emitting-element-array anode wiring patterns 11-1 and 11-2 of the wiring substrate 10 are connected to the light-emitting-element-array anode wiring patterns 111-1B and 111-2B of the base member 100. The light-emitting-element-array cathode wiring pattern 12 of the wiring substrate 10 is connected to the light-emitting-element-array cathode wiring pattern 112B of the base member 100. Similarly, the PD anode wiring pattern 13 of the wiring substrate 10 is connected to the PD anode wiring pattern 113B of the base member 100. The PD cathode wiring pattern 14 of the wiring substrate 10 is connected to the PD cathode wiring pattern 114B of the base member 100. The TD anode wiring pattern 15 of the wiring substrate 10 is connected to the TD anode wiring pattern 115B of the base member 100. The TD cathode wiring pattern 16 of the wiring substrate 10 is connected to the TD cathode wiring pattern 116B of the base member 100. Such connections are performed with a conductive adhesive, for example.

As understood from FIG. 8A, a portion of the light-emitting-element-array cathode wiring pattern 12 on the +x direction side is not covered by the base member 100. Thus, the driving unit 50 is mounted to be connected to the portion of the light-emitting-element-array cathode wiring pattern 12, which is not covered by the base member 100 in the wiring substrate 10.

In this manner, the light emitting device 4 illustrated in FIGS. 7A to 7C is configured.

With reference to FIG. 7A, since the light emitting element array 20 is disposed on the light-emitting-element-array cathode wiring pattern 112F of the base member 100, the cathode electrode 214 (see FIG. 4) of the light emitting element array 20 is connected to the light-emitting-element-array cathode wiring pattern 112F. The anode electrode 218 (see FIG. 4) of the light emitting element array 20 is connected to the light-emitting-element-array anode wiring pattern 111-1F of the base member 100 on the side surface 22A side of the light emitting element array 20 by the bonding wire 23A. The anode electrode 218 (see FIG. 4) of the light emitting element array 20 is connected to the light-emitting-element-array anode wiring pattern 111-2F of the base member 100 on the side surface 22B side of the light emitting element array 20 by the bonding wire 23B. The light-emitting-element-array anode wiring pattern is not provided on the side surfaces 21A and 21B of the light emitting element array 20. That is, the bonding wire for connecting the anode electrode 218 to the light-emitting-element-array anode wiring pattern is not provided on the side surfaces 21A and 21B sides of the light emitting element array 20. Thus, the driving unit 50 is disposed near the light emitting element array 20, and the PD 40 and the TD 45 being an example of the circuit element desired to be disposed near the light emitting element array 20 are disposed near to the light emitting element array 20. Here, the bonding wire such as the bonding wires 23A and 23B is an example of a wiring member that extends from the top electrode of the light emitting element array 20 toward the outside of the light emitting element array 20.

As illustrated in the cross-sectional view taken along line VIIB-VIIB which is shifted from the center portion of the wiring substrate 10 in the y-direction toward the −y direction side in FIG. 7B, the light-emitting-element-array anode wiring pattern 111-2F on the front surface of the base member 100 is connected to the light-emitting-element-array anode wiring pattern 111-2B on the back surface of the base member 100 through a via 111-2V. The light-emitting-element-array anode wiring pattern 111-2B is connected to the light-emitting-element-array anode wiring pattern 11-2 of the wiring substrate 10. The light-emitting-element-array anode wiring pattern 111-1F, the light-emitting-element-array anode wiring pattern 111-1B, and the light-emitting-element-array anode wiring pattern 11-1 are similar.

As illustrated in the cross-sectional view taken along line VIIC-VIIC at the center of the wiring substrate 10 in the y-direction in FIG. 7A, the light-emitting-element-array cathode wiring pattern 112F on the front surface of the base member 100 is connected to the light-emitting-element-array cathode wiring pattern 112B on the back surface of the base member 100 through a via 112V. The light-emitting-element-array cathode wiring pattern 112B is connected to the light-emitting-element-array cathode wiring pattern 12 of the wiring substrate 10. The light-emitting-element-array cathode wiring pattern 12 is connected to the driving unit 50.

The light-emitting-element-array anode wiring patterns 11-1 and 11-2 are connected to one terminal of the capacitor 70. The capacitor 70 may be provided for each of the light-emitting-element-array anode wiring patterns 11-1 and 11-2.

As illustrated in the cross-sectional view in FIG. 7B, the TD cathode wiring pattern 116F on the front surface of the base member 100 is connected to the TD cathode wiring pattern 116B on the back surface of the base member 100 through a via 116V. The TD cathode wiring pattern 116B is connected to the TD cathode wiring pattern 16 of the wiring substrate 10.

Similarly, the TD anode wiring pattern 115F on the front surface of the base member 100 is connected to the TD anode wiring pattern 115B on the back surface of the base member 100 through a via 115V. The TD anode wiring pattern 115B is connected to the TD anode wiring pattern 15 of the wiring substrate 10.

Since the above descriptions are similarly applied to the wiring pattern for connecting the PD 40, descriptions thereof will not be repeated.

In the exemplary embodiment, in the light emitting device 4, the driving unit 50 including the driving element is disposed near to the side surface 21A of the light emitting element array 20. The PD 40 and the TD 45 desired to be disposed near the light emitting element array 20 are disposed in parallel on the side surface 21B side of the light emitting element array 20, and thus the PD 40 and the TD 45 are disposed near the light emitting element array 20. A light emitting device 4' for a comparison to which the exemplary embodiment is not applied will be described.

Light Emitting Device 4' in Comparative Example

Figure 9A:
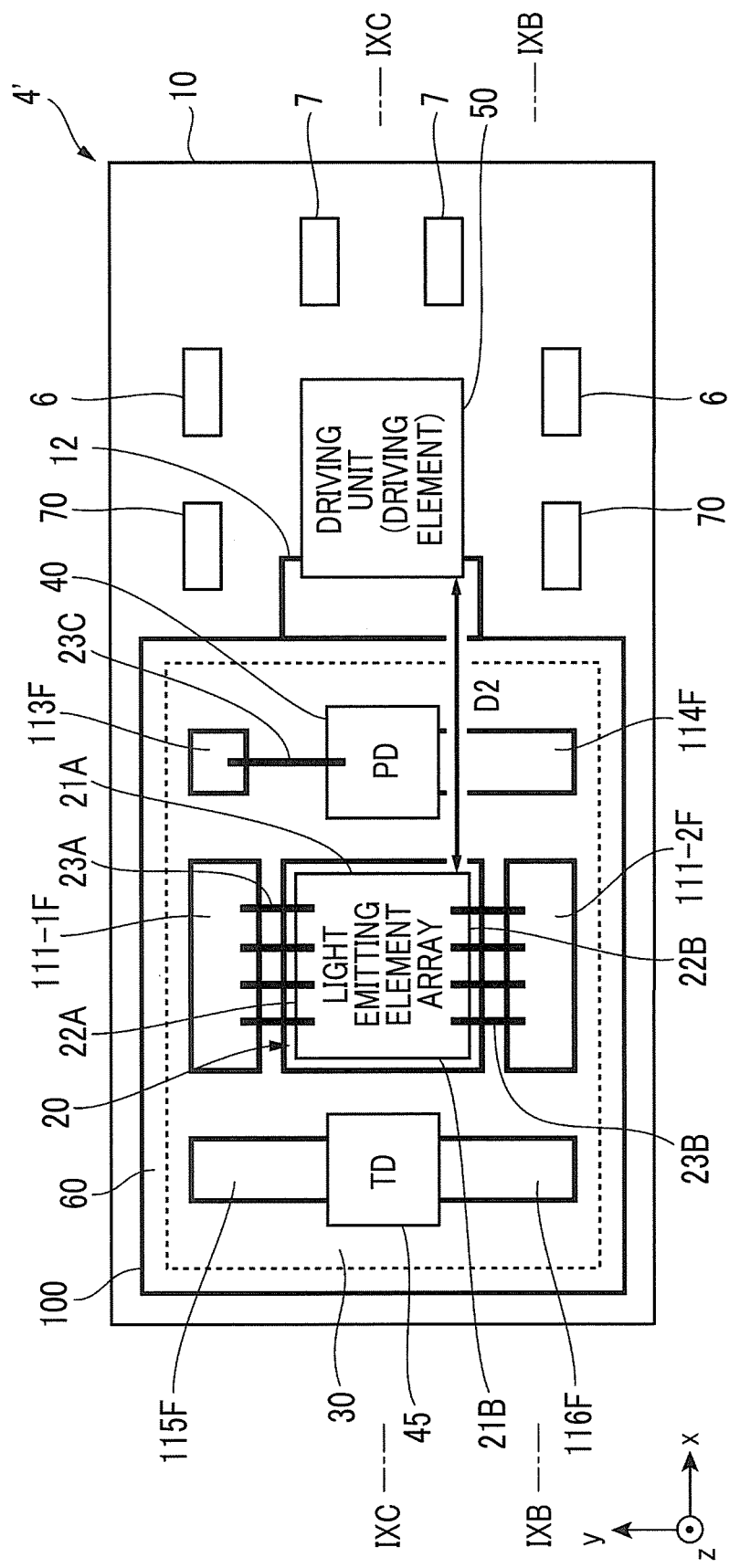

FIGS. 9A to 9C are plan views illustrating the light emitting device 4' for comparison. FIG. 9A is a plan view, FIG. 9B is a cross-sectional view taken along line IXB-IXB in FIG. 9A, and FIG. 9C is a cross-sectional view taken along line IXC-IXC in FIG. 9A. In the light emitting device 4', members having the same functions as functions of the light emitting device 4 are denoted by the same reference signs as reference signs in the light emitting device 4, and descriptions thereof will not be repeated.

In the light emitting device 4', the PD 40 is provided between the light emitting element array 20 and the driving unit 50 on the base member 100. That is, in the light emitting device 4', the PD 40 and the TD 45 desired to be disposed near the light emitting element array 20 are disposed with the light emitting element array 20 interposed therebetween. That is, the PD 40 is disposed near the side surface 21A side of the light emitting element array 20, and the TD 45 is disposed near the side surface 21B side of the light emitting element array 20. Therefore, the distance D2 between the side surface 21A of the light emitting element array 20 and the end portion of the driving unit 50 including the driving element on the light emitting element array 20 side is longer than the distance D1 of the light emitting device 4. Therefore, the inductance of the circuit that drives the light emitting element array 20 is increased, and thus the light emitting element array 20 is caused to turn ON and OFF at a high speed.

FIGS. 10A to 10C are diagrams illustrating a wiring pattern provided on the wiring substrate 10 and the base member 100 in the light emitting device 4' for the comparison. FIG. 10A illustrates the front surface of the wiring substrate 10, FIG. 10B illustrates the front surface of the base member 100, and FIG. 10C illustrates the back surface of the base member 100.

As illustrated in FIG. 10A, the PD anode wiring pattern 13 and the PD cathode wiring pattern 14 are provided to face each other with the light-emitting-element-array cathode wiring pattern 12 interposed therebetween on the ±y-direction side. That is, the wirings connected to the anode electrode and the cathode electrode of the PD 40 are led in directions reverse to each other along the side surface 21A of the light emitting element array 20. Similarly, the TD anode wiring pattern 15 and the TD cathode wiring pattern 16 are provided to face each other on the ±y-direction side. That is, the wirings connected to the anode electrode and the cathode electrode of the TD 45 are led in directions reverse to each other along the side surface 21B of the light emitting element array 20.

As illustrated in FIG. 10A, in the light emitting device 4', in order to suppress an occurrence of a situation in which the inductance of the circuit that drives the light emitting element array 20 increases, the planar shape of the light-emitting-element-array cathode wiring pattern 12 is set to be a quadrangle, and the cathode electrode 214 of the light emitting element array 20 is linearly connected to the drain of the MOS transistor 51 in the driving unit 50. Therefore, the light-emitting-element-array cathode wiring pattern 12 and the PD cathode wiring pattern 114F are three-dimensionally crossed with an electrically insulating member interposed therebetween.

Therefore, as illustrated in FIGS. 10B and 10C, the length of the PD cathode wiring pattern 114B corresponding to the PD cathode wiring pattern 114F in the y-direction is shorter than the PD cathode wiring pattern 114F on the −y direction side. Thus, an occurrence of a situation in which, in a case where the base member 100 is mounted on the portion of the wiring substrate 10, which is indicated by a broken line, the PD cathode wiring pattern 114B comes into contact with the light-emitting-element-array cathode wiring pattern 12, and thus is short-circuited is suppressed.

As described above, in the light emitting device 4' as the comparative example, in a case where the light-emitting-element-array cathode wiring pattern 12 is set to have a quadrangular shape, and the cathode electrode 214 of the light emitting element array 20 is linearly connected to the driving unit 50 in order to suppress the occurrence of a situation in which the inductance of the circuit that drives the light emitting element array 20 increases, the wirings are three-dimensionally crossed. That is, the base member 100 having an electrically insulating property is used.

In the light emitting device 4 to which the exemplary embodiment is applied, as understood from FIGS. 8A to 8C, the circuit element is not provided on the side surface 21A side of the light emitting element array 20. Thus, it is not required to provide a wiring intersecting with the light-emitting-element-array cathode wiring pattern 12. Thus, the base member 100 is used in FIGS. 7A to 8C, but the base member 100 may not be used. That is, the light emitting element array 20, the PD 40, and the TD 45 may be mounted on the wiring substrate 10 illustrated in FIG. 8A without interposing the base member 100. In this case, a heat dissipation member having an electrically insulating property may be used as the wiring substrate 10.

As described above, in the light emitting device 4 to which the exemplary embodiment is applied, the driving unit 50 including the driving element is disposed near the side surface 21A side of the light emitting element array 20. The PD 40 and the TD 45 desired to be disposed near the light emitting element array 20 are arranged side by side along the side surface 21B on the side surface 21B side of the light emitting element array 20. In this manner, the light emitting element array 20 and the driving unit 50 including the driving element are easily caused to be disposed to be near to each other.

In the exemplary embodiment, descriptions are made using the light quantity monitoring light receiving element (PD 40) as an example of the first circuit element and using the temperature detection element (TD 45) as an example of the second circuit element. However, other circuit elements such as the capacitor 70 for supplying a current to the light emitting element array 20 may be disposed as the first circuit element or the second circuit element.

In the exemplary embodiment, the light diffusion member 30 is used. However, instead of the light diffusion member 30, a configuration in which a member through which light is transmitted, for example, a transparent base member such as a protective cover or an optical member such as a condensing lens, a diffractive optical element or a microlens array may be used.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting device comprising:
    a wiring substrate;
    a light emitting element array that includes a first side surface and a second side surface facing each other, and a third side surface and a fourth side surface connecting the first side surface and the second side surface to each other and facing each other, the light emitting element array being provided on the wiring substrate;
    a driving element that is provided on the wiring substrate on the first side surface side and drives the light emitting element array;
    a first circuit element and a second circuit element that are provided on the wiring substrate on the second side surface side to be arranged in a direction along the second side surface; and
    a wiring member that is provided on the third side surface side and the fourth side surface side and extends from a top electrode of the light emitting element array toward an outside of the light emitting element array.

2. The light emitting device according to claim 1,
    wherein at least one of the first circuit element or the second circuit element is a light receiving element that receives light emitted by the light emitting element array.

3. The light emitting device according to claim 1,
    wherein at least one of the first circuit element or the second circuit element is a temperature detection element that detects a temperature of the light emitting element array.

4. The light emitting device according to claim 1,
    wherein the wiring member that extends from the top electrode of the light emitting element array toward the outside of the light emitting element array is not provided between the second side surface, and the first circuit element and the second circuit element.

5. The light emitting device according to claim 2,
    wherein the wiring member that extends from the top electrode of the light emitting element array toward the outside of the light emitting element array is not provided between the second side surface, and the first circuit element and the second circuit element.

6. The light emitting device according to claim 3,
    wherein the wiring member that extends from the top electrode of the light emitting element array toward the outside of the light emitting element array is not provided between the second side surface, and the first circuit element and the second circuit element.

7. The light emitting device according to claim 1,
    wherein each of the first circuit element and the second circuit element includes a plurality of terminals,
    the first circuit element is disposed closer to the third side surface side than the second circuit element,
    a wiring connected to each of the plurality of terminals in the first circuit element is led to the third side surface side,
    the second circuit element is disposed closer to the fourth side surface side than the first circuit element, and
    a wiring connected to each of the plurality of terminals in the second circuit element is led to the fourth side surface side.

8. The light emitting device according to claim 2,
    wherein each of the first circuit element and the second circuit element includes a plurality of terminals,
    the first circuit element is disposed closer to the third side surface side than the second circuit element,
    a wiring connected to each of the plurality of terminals in the first circuit element is led to the third side surface side,
    the second circuit element is disposed closer to the fourth side surface side than the first circuit element, and
    a wiring connected to each of the plurality of terminals in the second circuit element is led to the fourth side surface side.

9. The light emitting device according to claim 3,
wherein each of the first circuit element and the second circuit element includes a plurality of terminals,
the first circuit element is disposed closer to the third side surface side than the second circuit element,
a wiring connected to each of the plurality of terminals in the first circuit element is led to the third side surface side,
the second circuit element is disposed closer to the fourth side surface side than the first circuit element, and
a wiring connected to each of the plurality of terminals in the second circuit element is led to the fourth side surface side.

10. The light emitting device according to claim 4,
wherein each of the first circuit element and the second circuit element includes a plurality of terminals,
the first circuit element is disposed closer to the third side surface side than the second circuit element,
a wiring connected to each of the plurality of terminals in the first circuit element is led to the third side surface side,
the second circuit element is disposed closer to the fourth side surface side than the first circuit element, and
a wiring connected to each of the plurality of terminals in the second circuit element is led to the fourth side surface side.

11. The light emitting device according to claim 1,
wherein a light diffusion member that diffuses light emitted from the light emitting element array outward is provided on an emission path of the light emitting element array.

12. The light emitting device according to claim 2,
wherein a light diffusion member that diffuses light emitted from the light emitting element array outward is provided on an emission path of the light emitting element array.

13. The light emitting device according to claim 3,
wherein a light diffusion member that diffuses light emitted from the light emitting element array outward is provided on an emission path of the light emitting element array.

14. The light emitting device according to claim 11,
wherein at least one of the first circuit element or the second circuit element is a light receiving element that receives light emitted by the light emitting element array, and
the light diffusion member is provided at a position overlapping the light emitting element array and the light receiving element in plan view.

15. The light emitting device according to claim 1,
wherein the light emitting element array includes a plurality of light emitting elements connected in parallel to each other.

16. The light emitting device according to claim 1,
wherein the light emitting element array is a VCSEL array.

17. The light emitting device according to claim 1,
further comprising a diffractive optical element that diffracts light emitted from the light emitting element array on an emission path of the light emitting element array.

18. An optical device comprising:
the light emitting device according to claim 1; and
a light receiving unit that receives reflection light which is reflected by a measurement target after being emitted from the light emitting element array of the light emitting device,
wherein the light receiving unit outputs a signal corresponding to a period from emission of the light from the light emitting element array until the light receiving unit receives light.

19. An information processing apparatus comprising:
the optical device according to claim 18; and
a shape specifying unit that specifies a three-dimensional shape of a measurement target based on reflection light which is reflected by a measurement target after being emitted from the light emitting element array of the optical device, and is received by the light receiving unit of the optical device.

20. The information processing apparatus according to claim 19, further comprising:
an authentication processing unit that performs authentication processing for use of the information processing apparatus based on a result obtained by specification of the shape specifying unit.

* * * * *